United States Patent
Tomita

(10) Patent No.: US 6,724,085 B2
(45) Date of Patent: Apr. 20, 2004

(54) SEMICONDUCTOR DEVICE WITH REDUCED RESISTANCE PLUG WIRE FOR INTERCONNECTION

(75) Inventor: Kazuo Tomita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/214,360

(22) Filed: Aug. 8, 2002

(65) Prior Publication Data

US 2003/0107133 A1 Jun. 12, 2003

(30) Foreign Application Priority Data

Dec. 10, 2001  (JP) ........................................ 2001-376017

(51) Int. Cl.⁷ .............................................. H01L 23/48
(52) U.S. Cl. ........................ 257/758; 257/758; 257/757
(58) Field of Search .................................. 257/758, 383, 257/390, 393; 438/692, 597, 241, 666, 253, 640, 232, 580

(56) References Cited

U.S. PATENT DOCUMENTS

| | | | | |
|---|---|---|---|---|
| 5,366,930 A | * | 11/1994 | Kim | 438/668 |
| 5,401,681 A | * | 3/1995 | Dennison | 438/253 |
| 5,541,434 A | * | 7/1996 | Nicholls et al. | 257/383 |
| 5,874,359 A | * | 2/1999 | Liaw et al. | 438/640 |
| 6,140,241 A | * | 10/2000 | Shue et al. | 438/692 |
| 6,169,020 B1 | * | 1/2001 | Kim et al. | 438/597 |
| 6,177,304 B1 | * | 1/2001 | Li et al. | 438/233 |
| 6,352,890 B1 | * | 3/2002 | Sutcliffe | 438/241 |
| 6,534,389 B1 | * | 3/2003 | Ference et al. | 438/586 |

FOREIGN PATENT DOCUMENTS

JP          9-293865        11/1997

* cited by examiner

Primary Examiner—Son Mai
Assistant Examiner—Thinh T Nguyen
(74) Attorney, Agent, or Firm—McDermott, Will & Emery

(57) ABSTRACT

A semiconductor device miniaturizing the plane sizes of memory cells and a peripheral circuit part for a logic circuit and reducing wiring resistance and ensuring the degree of freedom in layout of wires on an interlayer isolation film. The semiconductor device comprises an active region included in a transistor formed on a semiconductor substrate, a wire formed on the semiconductor substrate, an interlayer isolation film covering the active region and the wire and a plug wire having a shape overlapping with both of the wire and the active region in plane, and the plug wire electrically connects the wire and the active region with each other.

15 Claims, 22 Drawing Sheets

SEMICONDUCTOR DEVICE WITH REDUCED RESISTANCE PLUG WIRE FOR INTERCONNECTION

BACKGROUND OF THE INVENTION

1. Field of the Invention

The present invention relates to a semiconductor device, and more specifically, it relates to a semiconductor device employing a plug wire connecting an active region included in a transistor and a wire with each other thereby implementing refinement and reducing the resistance of the plug wire.

2. Description of the Prior Art

A semiconductor device is recently so refined, highly integrated and increased in speed that plug wires of low resistance at a small pitch are extremely important. FIG. 43 is a plan view of a conventional semiconductor device in a stage of forming a second layer wire 114, and FIG. 44 is a sectional view taken along the line XLIV—XLIV in FIG. 43. Referring to FIGS. 43 and 44, an element isolation film 102 is provided on a silicon substrate 101 for isolating element regions from each other. A gate electrode 104 is formed on a gate oxide film 103 provided on the silicon substrate 101. A first layer wire 154, provided in parallel with the gate electrode 104 to have the same structure as the gate electrode 104, is arranged on the element isolation film 102.

An extension 106 of an n-conductivity type low-concentration region is arranged to hold a channel region located under the gate oxide film 103 between the same and another extension 106, and an active region (source/drain region) 108 of an $n^+$-conductivity type high-concentration region is formed in continuation to the extension 106. The active region includes both of the aforementioned $n^+$-conductivity type high-concentration region 108 and the extension 106.

Side wall insulator films 107 are formed to cover the side surfaces of the gate electrode 104 and surface parts of the silicon substrate 101 located on the bases thereof, and an interlayer isolation film 109 is formed to cover these elements. The second layer wire 114 is formed on the interlayer isolation film 109. Two contact holes 119 and 131 are opened in the interlayer isolation film 109. A plug wire 129 is embedded in the contact hole 119 for rendering the second layer wire 114 and the first layer wire 154 electrically conductive. Another plug wire 133 is embedded in the other contact hole 131 for rendering the second layer wire 114 and the active region 108 electrically conductive. Barrier metal layers 129a and 133a are provided on the side surfaces and the bottom surfaces of the plug wires 129 and 133 respectively, while a barrier metal layer 114a is provided also on the bottom portion of the second layer wire 114.

As shown in FIGS. 43 and 44, the distance between the plug wire 133 in contact with the active region 108 and the plug wire 129 in contact with the first layer wire 154 cannot be reduced beyond the minimum pitch L in plane. Therefore, the space between a gate electrode 104 provided on an active transistor and the gate electrode 154 provided on the element isolation film 102 is spread to about 1.5 times to twice the minimum pitch L, to disadvantageously increase the plane size (layout) of a memory cell or a peripheral circuit part of a logic circuit of an SRAM (static random access memory), for example.

When the thickness of the interlayer isolation film 109 is increased and the contact holes 119 and 131 are reduced in size, the resistance of wires including the plug wires 129 and 133 coupling the active region 108 and the gate electrode 104 with each other is disadvantageously extremely increased, for example.

Furthermore, a local wire included in the second layer wire 114 on the interlayer isolation film 109, for coupling the plug wire 133 provided on the active region 108 and the plug wire 129 provided on the first layer wire 154 disadvantageously limits the degree of freedom in the layout of the remaining wires.

SUMMARY OF THE INVENTION

An object of the present invention is to refine the plane size of a memory cell a peripheral circuit part of a logic circuit of a semiconductor device.

Another object of the present invention is to reduce the electric resistance of a wire including a plug wire and enlarge the degree of freedom in layout of the wire on an interlayer isolation film.

A semiconductor device according to the present invention comprises an active region included in a transistor formed on a semiconductor substrate, a wire formed on the semiconductor substrate, an interlayer isolation film covering the active region and the wire, and a plug wire having a shape overlapping with both of the wire and the active region in plane through the interlayer isolation film, for electrically connecting the wire and the active region with each other.

According to this structure, the electric resistance of the plug wire can be reduced. Furthermore, miniaturization of the plane size of the semiconductor device such as a memory cell of an SRAM generally limited by the space between contact holes can be further advanced. No second layer wire may be required for merely electrically connecting the active region and the aforementioned wire with each other. Therefore, the degree of freedom in the layout of the second layer wire on the interlayer isolation film can be increased. The aforementioned transistor may be any transistor such as a MOSFET (metal-oxide-semiconductor field-effect transistor) so far as the same is a field-effect transistor. For example, the wire according to the present invention may be any wire so far as the same is not a gate electrode in the transistor including the active region.

In the semiconductor device according to the present invention, the wire can be the gate electrode of a transistor located adjacent to the transistor including the active region.

According to this structure, the miniaturization of an SRAM, a multistage amplifier, a wired logic circuit or the like can be promoted. Furthermore, the electric resistance of the plug wire itself can be reduced.

In the semiconductor device according to the present invention, the wire can be located on an element isolation film isolating an element region to which the transistor including the active region belongs from another element region.

According to this structure, electrical connection between the active region and the wire can be implemented with a single plug, for prompting miniaturization of the semiconductor device. Furthermore, no second layer wire may be provided for merely electrically connecting the active region and the wire with each other.

In the semiconductor device according to the present invention, the side surface of the wire can be covered with an insulating layer continuously covering the side surface of the wire and a surface part of the semiconductor substrate located on the base of the side surface in a cross section of the wire.

According to this structure, it is possible to prevent the surface of an extension region from damage when removing a side wall outer-layer spacer from the gate electrode.

In the semiconductor device according to the present invention, the side surface of the wire can be covered with an insulating layer covering only the side surface of the wire in a cross section of the wire.

According to this structure, the contact area between the plug wire and the active region can be increased for reducing the electric resistance on the interface between the plug wire and the active region.

The semiconductor device according to the present invention can further comprise a second active region included in a transistor, different from the transistor including the active region, located adjacent to the wire, while the plug wire can be provided in a shape also overlapping with the second active region in plane in addition to the wire and the active region for electrically connecting the wire and the active region with the second active region.

According to this structure, the area of the cross section of the plug wire is increased and the electric resistance of the plug wire is reduced, while three plugs are integrated into one plug so that remarkable refinement can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
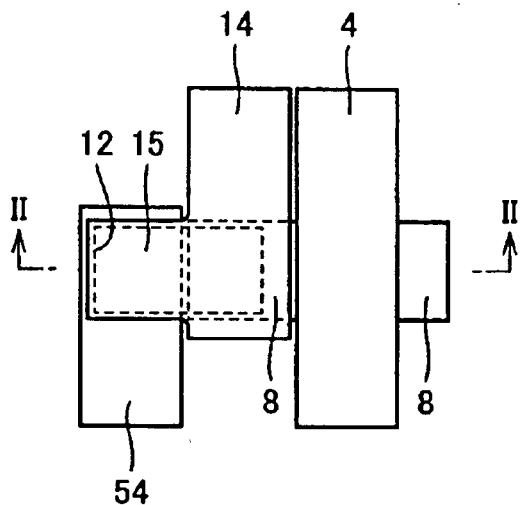
FIG. 1 is a plan view of a semiconductor device according to a first embodiment of the present invention.
Figure 2:
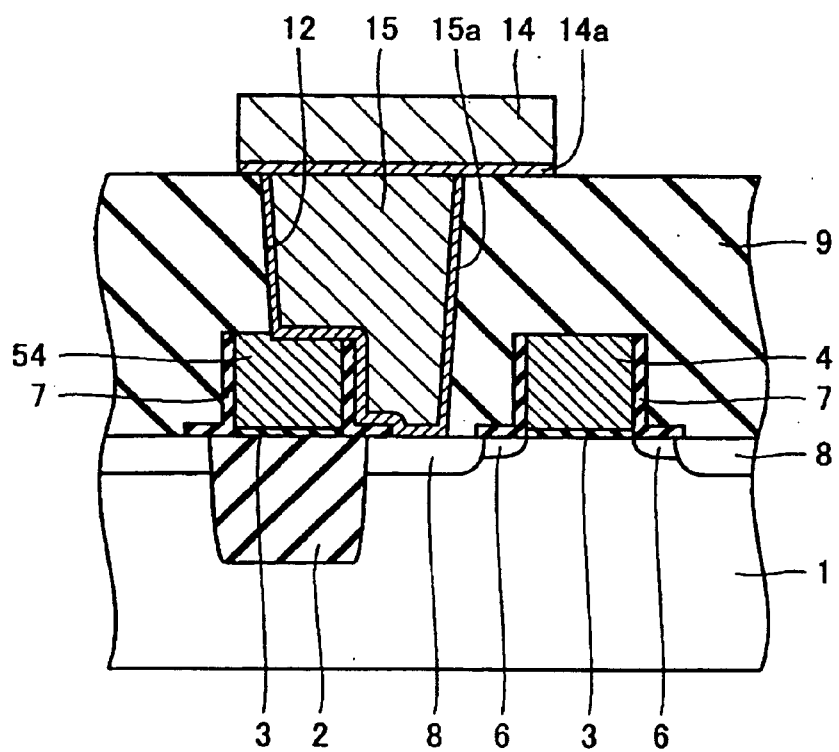
FIG. 2 is a sectional view taken along the line II—II in FIG. 1.

FIG. 1 is a plan view of a semiconductor device according to a first embodiment of the present invention, and FIG. 2 is a sectional view taken along the line II—II in FIG. 1. Referring to FIG. 1, an active region 8 is provided on a silicon substrate 1, and a gate electrode 4 is arranged on the active region 8. A wire (first layer wire) 54 having the same structure as the gate electrode 4 is formed in parallel with the gate electrode 4. A plug wire 15 is in contact with both of the active region 8 and the first layer wire 54, for electrically connecting the active region 8 and the first layer wire 54 with each other. A second layer wire 14 is provided in contact with the upper portion of the plug wire 15.

Referring to FIG. 2, the silicon substrate 1 is a silicon wafer of p-type silicon having specific resistance of 10 Ω·cm, for example. The gate electrode 4 is arranged on a gate oxide film 3, while the first layer wire 54 having the same sectional structure as the gate electrode 4 is provided on an element isolation film 2.

The element isolation film 2 is formed by embedding a plasma oxide film (HDP (high density plasma) film) of 300 nm by trench isolation. An oxynitride film (SiON film) of 3 nm can be employed for the gate oxide film 3. When the gate oxide film 3 is formed by an oxidation process or the like, only an extremely thin oxide layer is formed on the element isolation film 2 aside from the active region 8. Referring to FIG. 2, the part of the gate oxide film 3 located on the element isolation film 2 is exaggerated in thickness. When vapor deposition is employed, however, the gate oxide film 3 is formed with a clearly recognizable prescribed thickness not only on the active region 8 but also on the element isolation film 2.

The gate electrode 4 is made of polysilicon of 100 nm. Non-doped polysilicon is deposited by 100 nm and patterned in an n-conductivity type region and a p-conductivity type region respectively. Thereafter phosphorus ($P^+$) is implanted into the n-type conductivity region with acceleration energy of 10 keV and density of 5E15 $cm^{-2}$. Further, boron ($B^+$) is implanted into the p-type conductivity region with acceleration energy of 3 keV and density of 5E15 $cm^{-2}$. Consequently, the gate electrode 4 of the respective regions is formed. An extension 6 of an n-conductivity type low-concentration layer is provided on the silicon substrate 1. This extension 6 is formed by injecting arsenic with acceleration energy of 30 keV and density of 1E14 $cm^{-2}$ at an angle of 45°. The side surfaces of the gate electrode 4 and surface parts of the silicon substrate 1 located on the bases thereof are covered with side wall inner-layer insulator films 7, which are L-shaped nitride films of 10 nm in thickness.

An $n^+$-conductivity type high-concentration layer 8 is formed on the surface of the silicon substrate 1 in continuation with the extension 6. This $n^+$-conductivity type high-concentration layer 8 is formed by injecting arsenic with acceleration energy of 50 keV and density of 5E15 $cm^{-2}$. An interlayer isolation film 9 is provided to cover these elements. This interlayer isolation film 9 is formed by depositing an HDP oxide film by 700 nm.

A contact hole 12 is opened in the interlayer isolation film 9 to reach the first layer wire 54 and the active region 8. The plug wire 15 (15a) is formed to fill up the contact hole 12. The plug wire 15 (15a) electrically connects the gate electrode 4 and the active region 8 with each other. This plug wire 15 (15a) is formed by a barrier metal layer 15a forming an outer layer and an inner layer 15 formed inside the barrier metal layer 15a. The barrier metal layer 15a is a composite layer consisting of a TiN layer of 20 nm and a Ti layer of 20 nm. Tungsten (W) is embedded inside the barrier metal layer 15a by CVD (chemical vapor deposition), for forming a tungsten plug 15.

The second layer wire 14 is formed on the plug wire 15 (15a) to be electrically connected thereto. The second layer wire 14 is formed by a tungsten (W) layer 14 of 100 nm in thickness and a multilayer film 14a of a TiN layer of 20 nm and a Ti layer of 20 nm.

Thus, the active region 8 and the gate electrode 4 are connected with each other by the plug 15 (15a) having a wide sectional shape, whereby the electric resistance of the plug 15 (15a) can be reduced. Further, the layout area of a portion generally rated at a hole pitch can be reduced.

Figure 3:
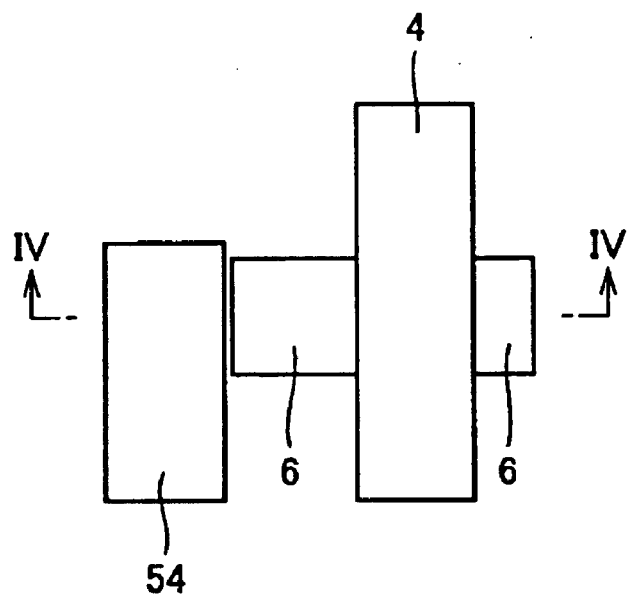
FIG. 3 is a plan view showing a stage of forming a gate electrode and a low-concentration impurity layer in fabrication of the semiconductor device shown in FIG. 1.
Figure 4:
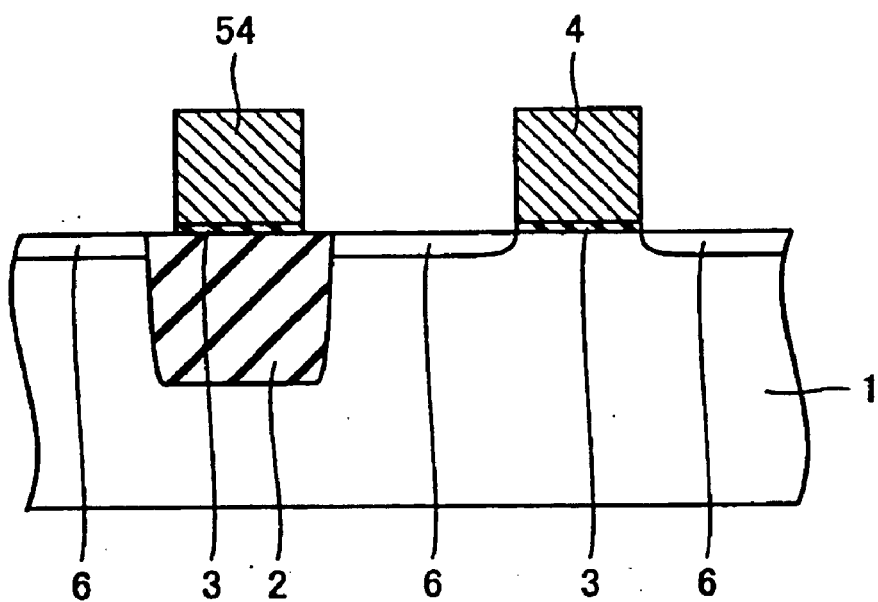
FIG. 4 is a sectional view taken along the line IV—IV in FIG. 3.

A method of fabricating the semiconductor device according to this embodiment is now described with reference to FIGS. 3 to 9. As shown in FIGS. 3 and 4, the element isolation film 2 of 300 nm is formed on the silicon substrate 1 by STI (shallow trench isolation). Then, the gate oxide film 3 of oxynitride (SiON), for example, is formed by 3 nm. Non-doped polysilicon is deposited thereon by 100 nm for defining the gate electrode 4. The first layer wire 54 having the same structure as the gate electrode 4 is formed in parallel with this formation of the gate electrode 4.

Then, resist is patterned to open the n-conductivity type region, and phosphorus ($P^+$), for example, is implanted with acceleration energy of 10 keV and density of 5E15 $cm^{-2}$. Similarly, boron ($B^+$), for example, is implanted into the p-conductivity type region with acceleration energy of 3 keV and density of 5E15 $cm^{-2}$. Then, resist is patterned by dry etching for forming the gate electrode 4. Then, the $n^-$-conductivity type low-concentration layer 6 for defining the extension is formed by injecting arsenic ($As^+$), for example, with acceleration energy of 30 keV and density of 1E14 $cm^{-2}$ at an angle of 45°.

Figure 5:
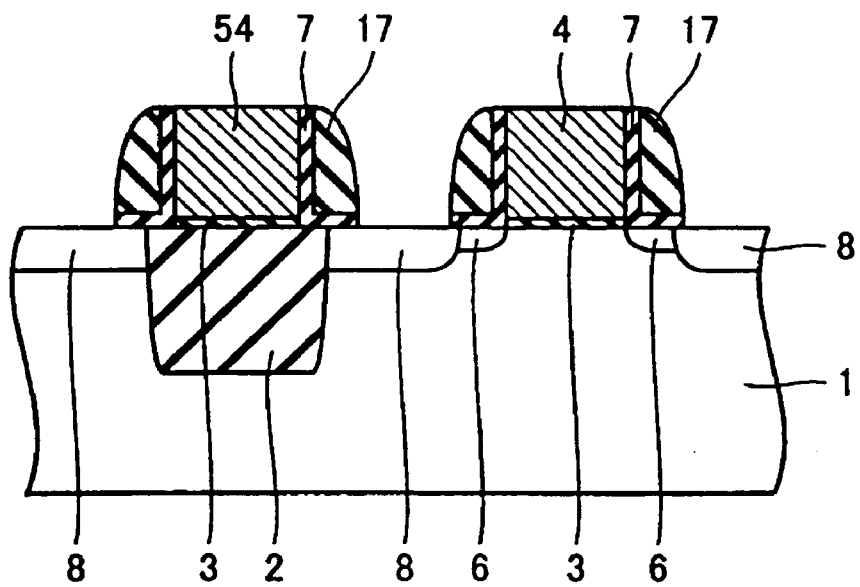
FIG. 5 is a sectional view in a stage of forming a high-concentration impurity layer through side wall insulator films employed as masks.

As shown in FIG. 5, nitride films are formed by 10 nm as the side wall inner-layer insulator films 7. Then, oxide films for defining side wall outer-layer spacers 17 are deposited by 80 nm and etched back. Then, the $n^+$-conductivity type high-concentration layer 8 is formed by injecting arsenic with acceleration energy of 50 keV and density of 5E15 $cm^{-2}$.

Figure 6:
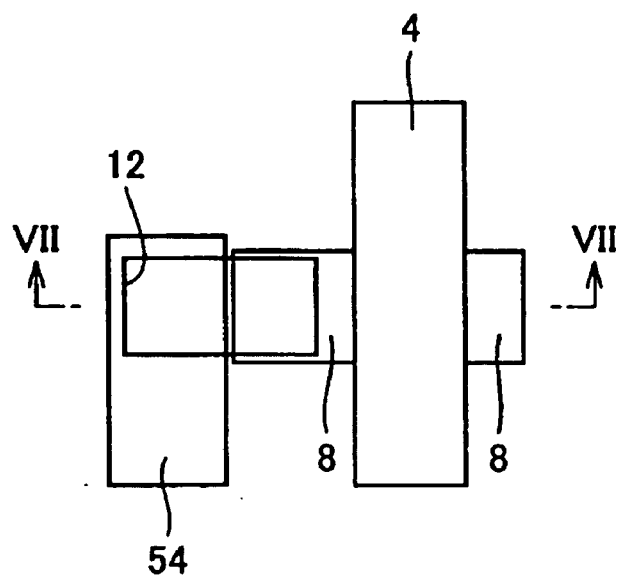
FIG. 6 is a plan view in a stage of opening a contact hole in an interlayer isolation film.
Figure 7:
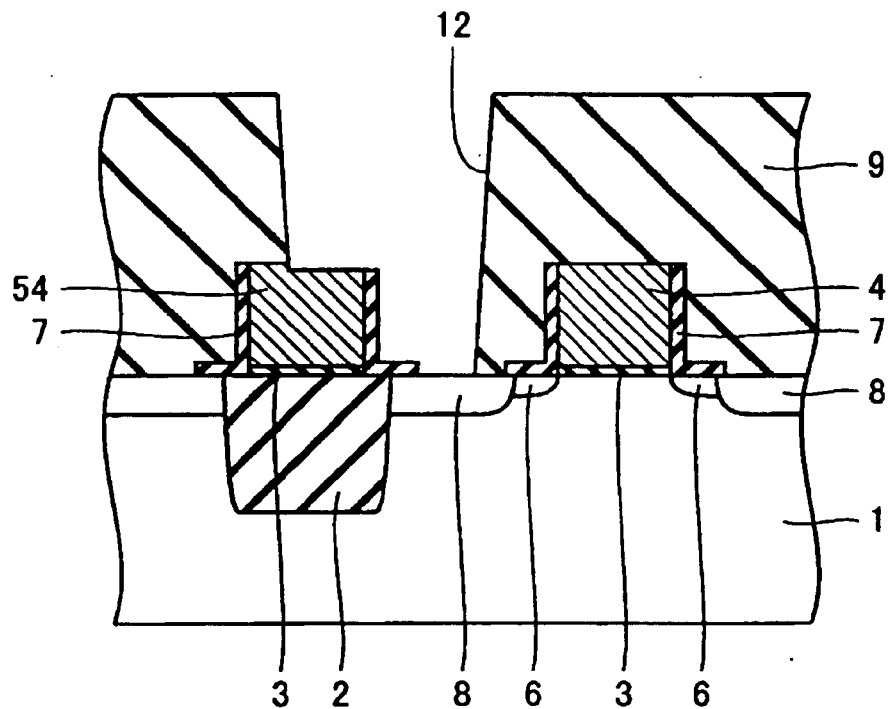
FIG. 7 is a sectional view taken along the line VII—VII in FIG. 6.

Then, only the side wall outer-layer spacers 17 are removed by wet etching. At this time, the nitride films of the side wall inner-layer insulator films 7 are not wet-etched but left in L shapes. Then, an HDP oxide film for forming the interlayer isolation film 9 is deposited by 1000 nm and polished by 300 nm through CMP (chemical mechanical polishing). Then, the contact hole 12 of 0.2 μm in diameter is opened by dry etching through a resist mask, as shown in FIGS. 6 and 7. At this time, the dry etching is carried out under conditions for attaining sufficiently high etching selection ratios between the gate electrode 4 and the $n^+$-conductivity type high-concentration layer 8 and the interlayer isolation film 9.

Figure 8:
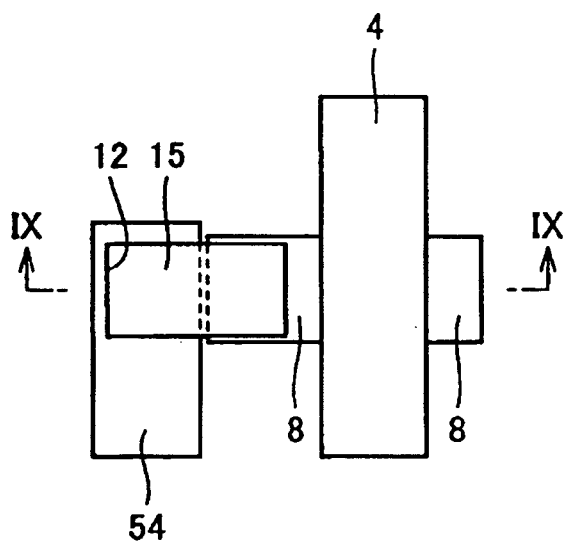
FIG. 8 is a plan view in a stage of forming a conductive layer for a plug in the contact hole.
Figure 9:
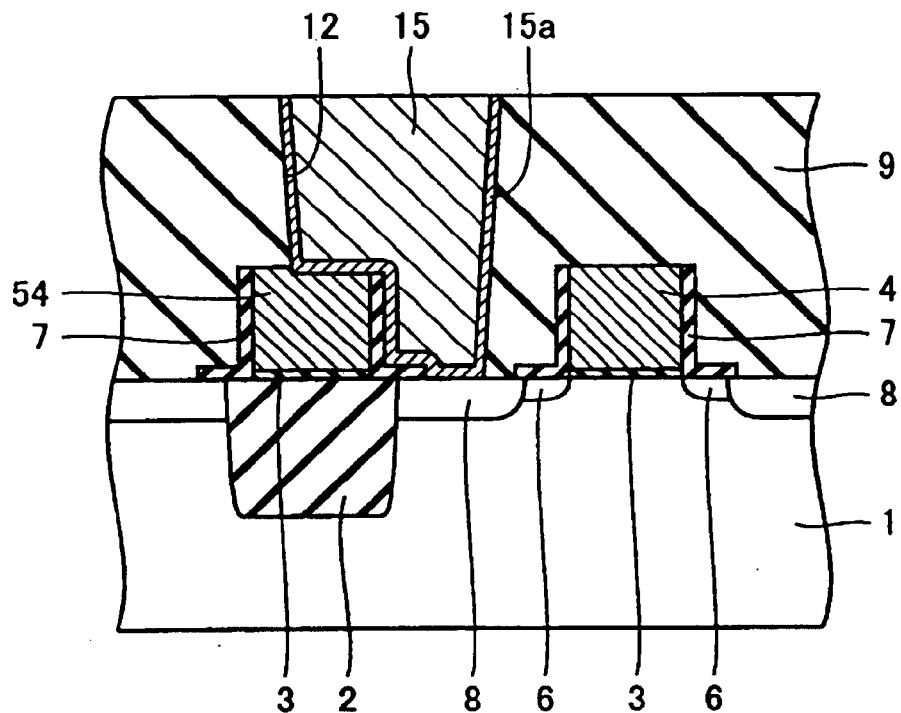
FIG. 9 is a sectional view taken along the line IX—IX in FIG. 8.

As shown in FIGS. 8 and 9, the TiN layer of 20 nm and the Ti layer of 20 nm are formed for defining the barrier metal layer 15a of the plug wire 15 (15a). Then, tungsten (W) is deposited by 200 nm through CVD and polished by CMP, for forming the tungsten plug 15.

Thereafter the upper tungsten layer 14 of 100 nm and the lower multilayer film 14a consisting of the TiN layer of 20 nm and the Ti layer of 20 nm are deposited and patterned for defining the second layer wire 14.

As hereinabove described, the active region 8 and the gate electrode 4 are connected with each other by the plug wire 15 (15a) having a wide sectional shape, whereby the electric resistance of the plug wire 15 (15a) can be reduced. Further, the layout area of the portion generally rated at a contact hole pitch can be reduced.

The elements (a1) to (a10) forming the semiconductor device according to this embodiment can be modified as follows, for example. Other modifications are also available within the range of the present invention, as a matter of course.

(a1) Gate Electrode: The gate electrode 4, made of polysilicon in this embodiment, may alternatively be prepared from doped polysilicon. Polysilicide stacked with silicide such as $WSi_2$, $CoSi_2$ or $NiSi_2$ may also be employed as the material for the gate electrode 4. Further, a polymetal stacked with a metal such as W, Al, Ru or Pt or a metal such as W or Al itself may be employed.

(a2) Active Region: The plug wire 15 is directly electrically connected to the $n^+$-conductivity type high-concentration layer of the active region 8 in this embodiment. The surface layer of the active region 8 may alternatively be made of silicide such as $WSi_2$, $CoSi_2$ or $NiSi_2$, in order to reduce electric resistance from the active region 8 to the plug wire 15.

(a3) Plug Wire: The plug wire 15 is made of tungsten in this embodiment. The plug wire 15 may alternatively be made of polycrystalline silicon or a metal such as Al, TiN or Ru.

(a4) Barrier Metal Layer of Plug Wire: The barrier metal layer 15a of the plug wire 15 is formed by CVD, as hereinabove described. Alternatively, the barrier metal layer 15a of the plug wire 15 may be formed by sputtering. When the barrier metal layer 15a of the plug wire 15 is formed by a multilayer film of TiN and Ti through CVD or sputtering, the thicknesses of the Ti layer and the TiN layer are preferably 1 to 100 nm respectively.

(a5) Second Layer Wire: The second layer wire 14 is formed following formation of the plug wire 15 (15a), as hereinabove described. In this case, a tungsten film may be formed after opening the contact hole 12 for forming the second layer wire 14 as such. The second layer wire 14 may not be formed if the gate electrode 4 and the active region 8 are simply connected with each other.

(a6) Upper Layer Insulator Film for Gate Electrode: While the gate electrode 4 is made of polysilicon in this embodiment, an oxide film, a nitride film or a multilayer film of oxide and nitride may be arranged thereon as a hard mask. In this case, the plug wire 15 can be readily electrically connected to the gate electrode 4 by optimizing etching conditions when forming the plug wire 15.

(a7) Interlayer Isolation Film: According to this embodiment, the HDP oxide film is directly formed to cover the gate electrode 4 and the active region 8 for defining the interlayer isolation film 9, followed by opening of the contact hole 12. Alternatively, a nitride film or a multilayer film of nitride and oxide may be formed for thereafter opening the contact hole 12 by etching in an SAC (self align contact) system.

(a8) Element Isolation Film etc.: While the element isolation film 2 and the interlayer isolation film 9 are formed by HDP oxide films in this embodiment, FSG (F-doped silicate glass) films, BPSG films, PSG films, SiOC films, organic films, SiON films, SiC films or SiCF films may alternatively be employed.

(a9) Side Wall Inner-Layer Insulator Film: While the nitride films for defining the side wall inner insulator films 7 are 10 nm in this embodiment, the nitride films may alternatively be 1 to 50 nm. If a large selection ratio can be set when removing the side wall outer-layer spacers 17, oxide films or a multilayer structure of oxynitride films and oxide films may be employed for the side wall insulator films 7.

(a10) Side Wall Outer-Layer Spacer: While the side wall outer-layer spacers 17 are formed by oxide films in this embodiment, PSG (phosphosilicate glass) or BPSG (borophosphosilicate glass) films may alternatively be employed if a large etching selection ratio can be set when removing the side wall outer-layer spacers 17.

(Second Embodiment)

Figure 10:
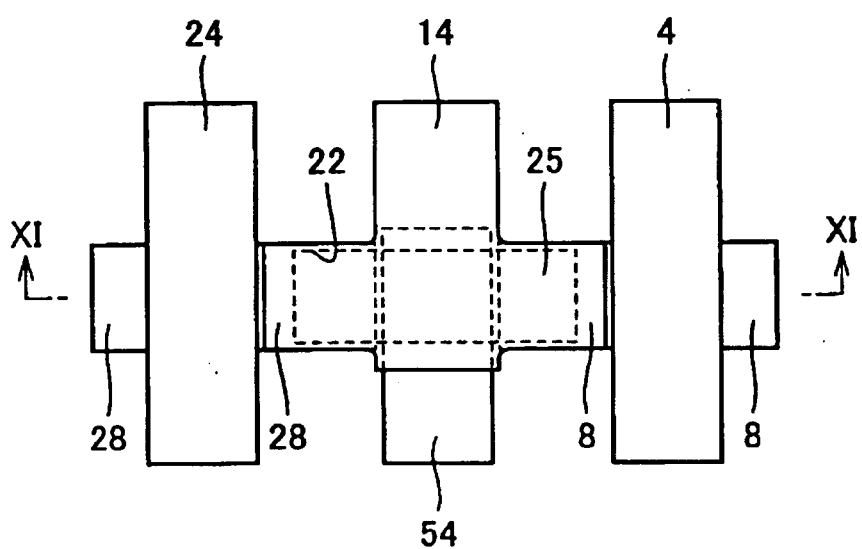
FIG. 10 is a plan view of a semiconductor device according to a second embodiment of the present invention.
Figure 11:
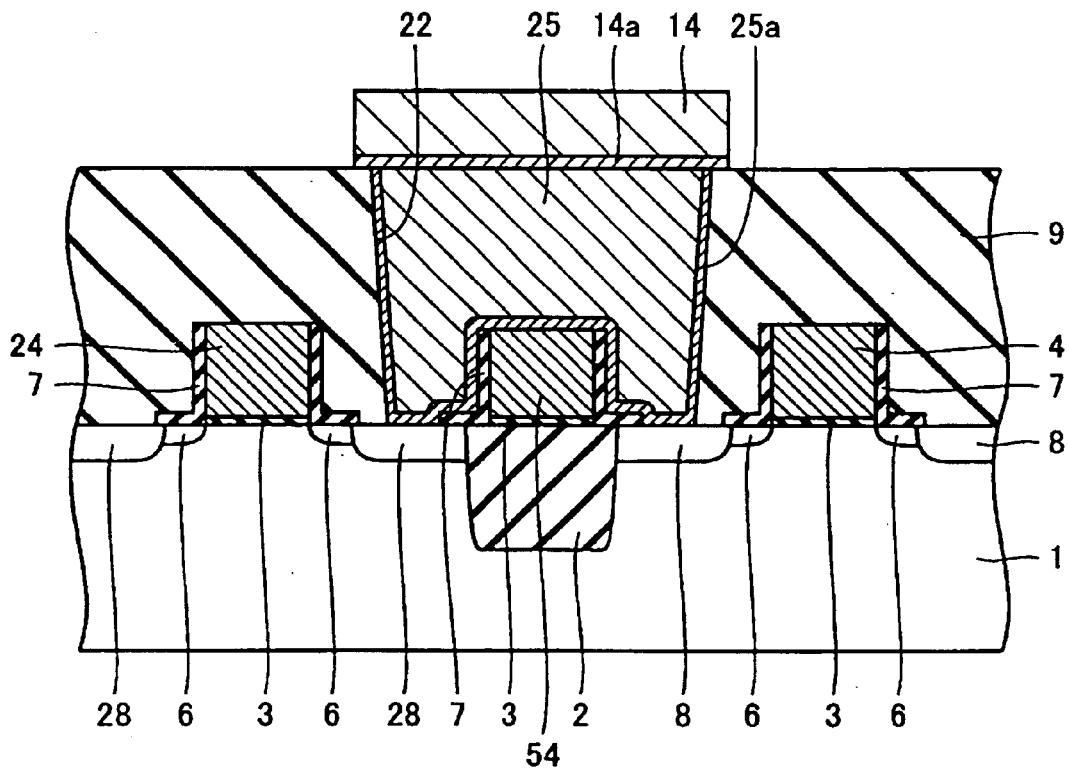
FIG. 11 is a sectional view taken along the line XI—XI in FIG. 10.

FIG. 10 is a plan view of a semiconductor device according to a second embodiment of the present invention, and FIG. 11 is a sectional view taken along the line XI—XI in FIG. 10. This embodiment is a modification of the first embodiment, and characterized in that three plugs are integrated into a single shared contact plug.

Referring to FIG. 10, the semiconductor device is provided with two gate electrodes 4 and 24 and a wire (first layer wire) 54 parallel to the gate electrodes 4 and 24. An active region 8 is arranged to hold the right gate electrode 4 between the same and another active region 8, and an active region 28 is arranged to hold the left gate electrode 24 between the same and another active region 28. A plug wire 25 is in contact with at least three portions, i.e., the central first layer wire 54 and the active regions 8 and 28 located on both sides thereof, for electrically connecting these elements with each other. A second layer wire 14 is arranged on the plug wire 25.

Referring to FIG. 11, a silicon substrate 1 is formed by a p-conductivity type silicon wafer, for example. An element isolation film 2 isolating element regions from each other is provided on the silicon substrate 1. This element isolation film 2 is formed by embedding a plasma oxide film of 300 nm by trench isolation. A gate oxide film 3, formed by an oxynitride film (SiON film) of 3 nm, for example, is provided under the gate electrode 4. The gate electrode 4 located on the gate oxide film 3 is made of polysilicon of 100 nm. Side wall inner-layer insulator films 7 are arranged to cover the side surfaces of the gate electrode 4 and surface parts of the silicon substrate 1 located on the bases thereof. The side wall inner-layer insulator films 7, having L-shaped sections, are formed by depositing nitride films by 10 nm. An $n^+$-conductivity type high-concentration layer 8 is formed on the surface of the silicon substrate 1 in continuation with an extension region 6 of a low-concentration region. The $n^+$-conductivity type high-concentration layer 8 is formed by injecting arsenic with acceleration energy of 50 keV and density of 5E15 $cm^{-2}$.

An interlayer isolation film 9 is formed to cover these elements by depositing an HDP oxide film by 700 nm. A contact hole 22 is opened in this interlayer isolation film 9, and a plug 25 filling up the contact hole 22 electrically connects the first layer wire 54 and the active regions 8 and 28 located on both sides thereof with each other. A barrier metal layer 25a forming the outer layer of this plug 25 has a multilayer structure consisting of a TiN layer of 20 nm and a Ti layer of 20 nm. An inner layer 25 of the barrier metal layer 25a is filled up with tungsten by CVD for forming a tungsten plug.

Thus, the single plug 25 (25a) electrically connects the first layer wire 54 with the active regions 8 and 28 located on both sides thereof, whereby the resistance of the plug 25 can be reduced. Further, the layout area of a portion rated by the minimum hole interval can be reduced. In addition, no local wire may be provided for connecting two or three contact holes with each other. In this case, the degree of freedom in layout is increased in the second layer wire 14 and layout conditions or the like can be relaxed on strict pitch portions.

Figure 12:
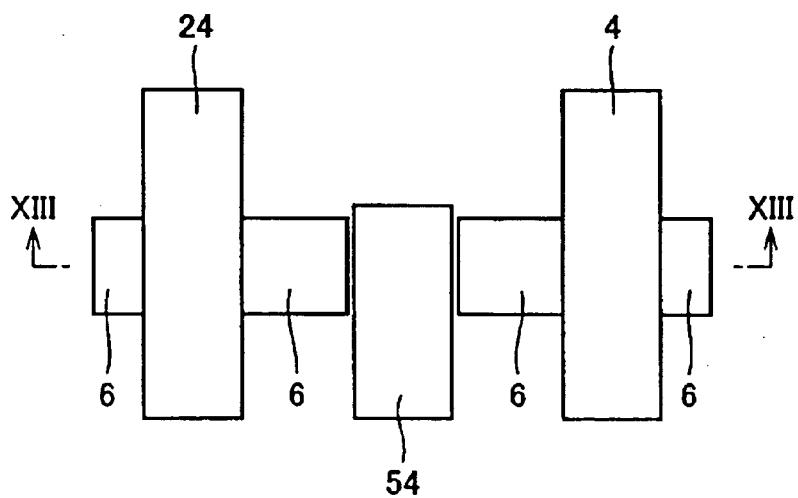
FIG. 12 is a plan view in a stage of forming a gate electrode and a low-concentration impurity layer in fabrication of the semiconductor device shown in FIG. 10.
Figure 13:
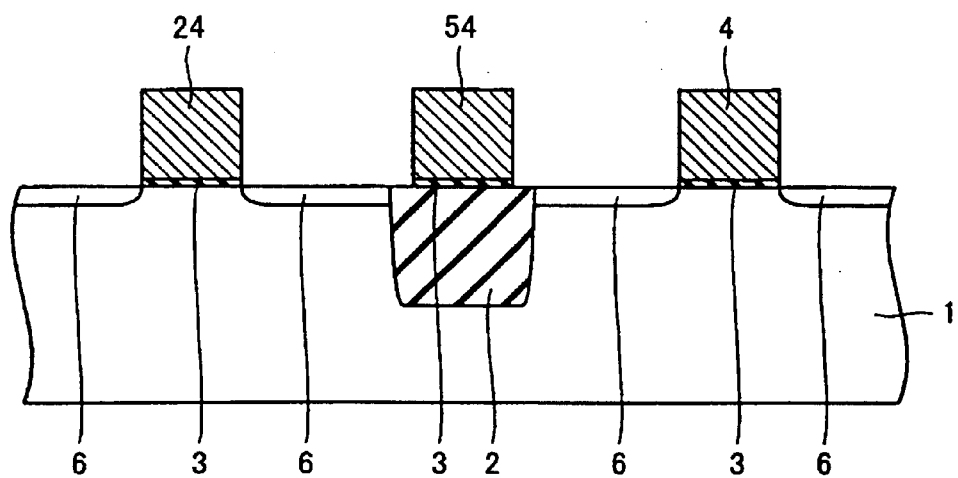
FIG. 13 is a sectional view taken along the line XIII—XIII in FIG. 12.

A method of fabricating the semiconductor device according to this embodiment is now described with reference to FIGS. 12 to 18. As shown in FIGS. 12 and 13, the element isolation film 2 of 300 nm is formed on the silicon substrate 1 by STI (shallow trench isolation). Then, an oxynitride film (SiON) is formed by 3 nm for defining the gate oxide film 3. Non-doped polycrystalline silicon for forming the gate electrode 4 is deposited thereon by 100 nm, and phosphorus ($P^+$) is implanted into an n-conductivity type region with acceleration energy of 10 keV and density of 5E15 $cm^{-2}$ through a resist mask. Then, boron ($B^+$) is similarly implanted into a p-conductivity type region with acceleration energy of 3 keV and density of 5E15 $cm^{-2}$ through a resist mask. Then, the gate electrode 4 is formed by dry etching through a resist mask. In formation of this gate electrode 4, the first layer wire 54 is formed on the element isolation film 2 in the same structure as the gate electrode 4.

The $n^-$-conductivity type low-concentration layer 6 defining the extension is formed by injecting arsenic ($As^+$) with acceleration energy of 30 keV and density of 1E14 $cm^{-2}$ at an angle of 45°.

Figure 14:
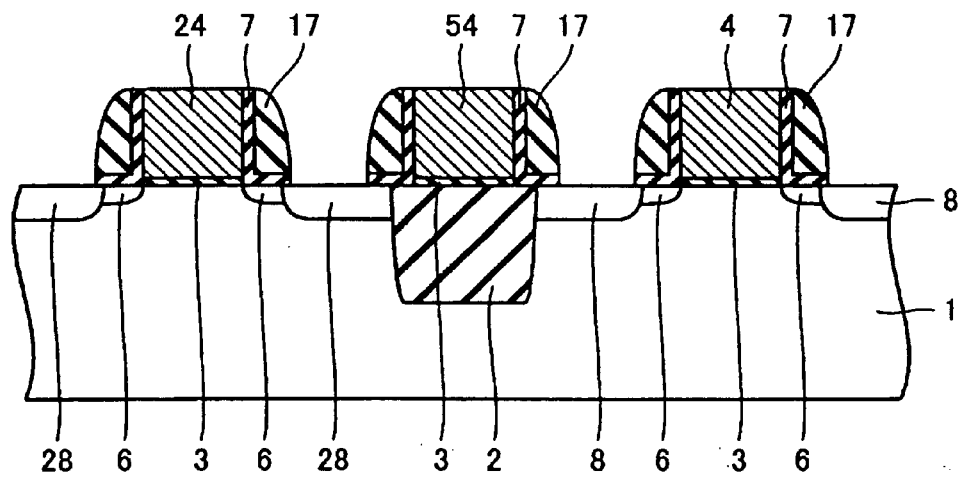
FIG. 14 is a sectional view in a stage of forming a high-concentration impurity layer through side wall insulator films employed as masks.

As shown in FIG. 14, nitride films for defining the side wall inner-layer insulator films 7 and oxide films 17 for forming side wall outer-layer spacers are deposited by 100 nm and 80 nm respectively and etched back, thereby forming side walls. Thereafter arsenic is implanted with acceleration energy of 50 keV and density of 5E15 $cm^{-2}$ for forming the $n^+$-conductivity type high-concentration layer 8.

Figure 15:
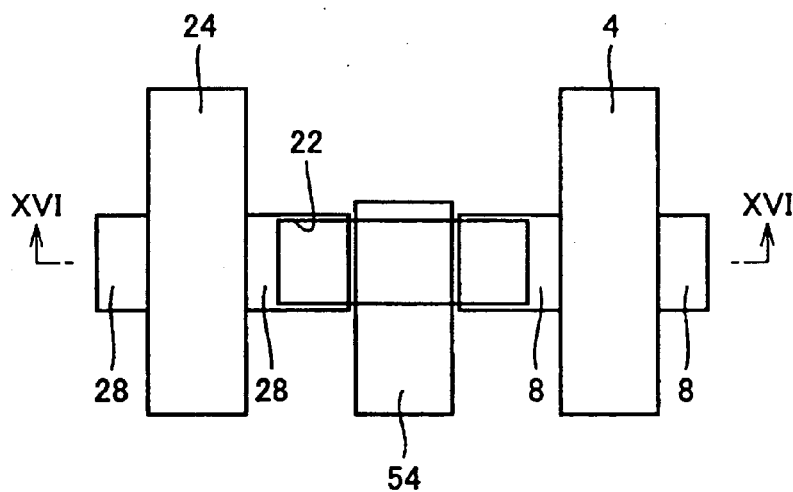
FIG. 15 is a plan view in a stage of opening a contact hole in an interlayer isolation film.
Figure 16:
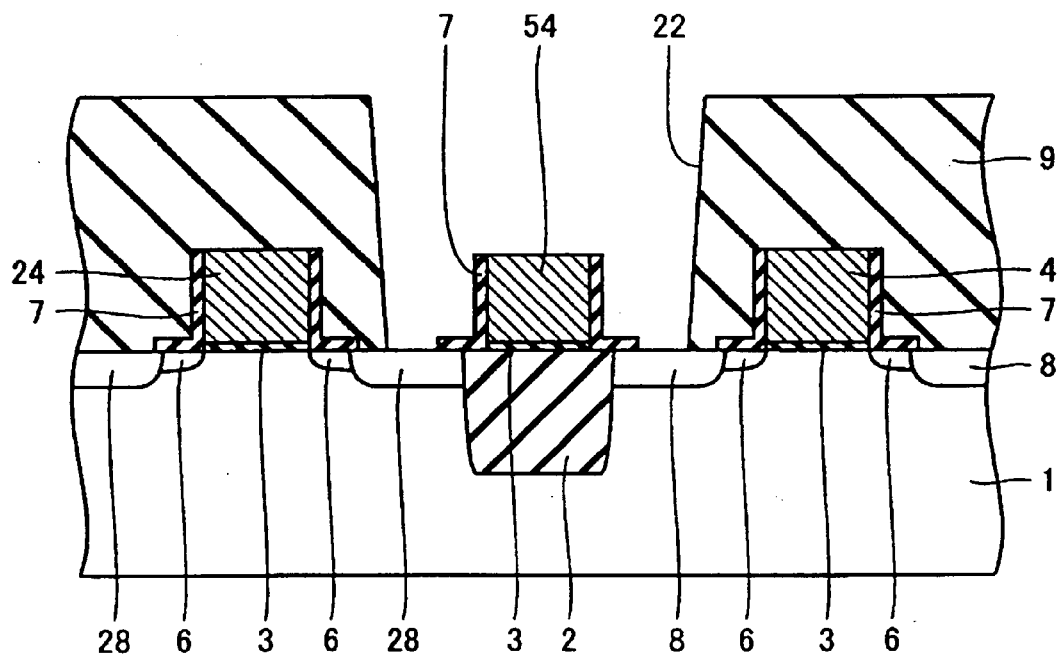
FIG. 16 is a sectional view taken along the line XVI—XVI in FIG. 15.

Then, only the spacer oxide films 17 are removed by wet etching, as shown in FIGS. 15 and 16. Then, the interlayer isolation film 9 is formed by depositing an HDP oxide film by 1000 nm and polishing the same by 700 nm through CMP. Then, the contact hole 22 is opened in a diameter of 0.2 μm by wet etching through a resist mask. At this time, the dry etching is carried out under conditions for attaining sufficiently high etching selection ratios between the first layer wire 54 and the $n^+$-conductivity type high-concentration layers 8 and 28 and the interlayer isolation film 9.

Figure 17:
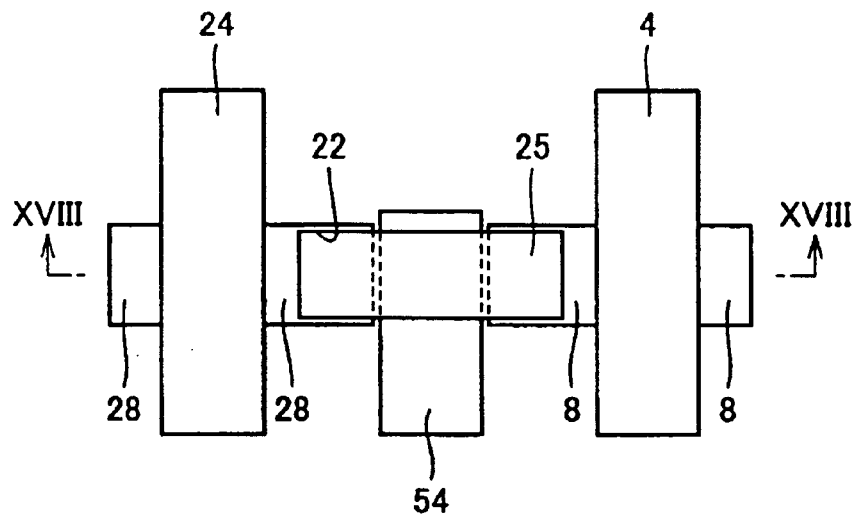
FIG. 17 is a plan view in a stage of forming a conductive layer for a plug in the contact hole.
Figure 18:
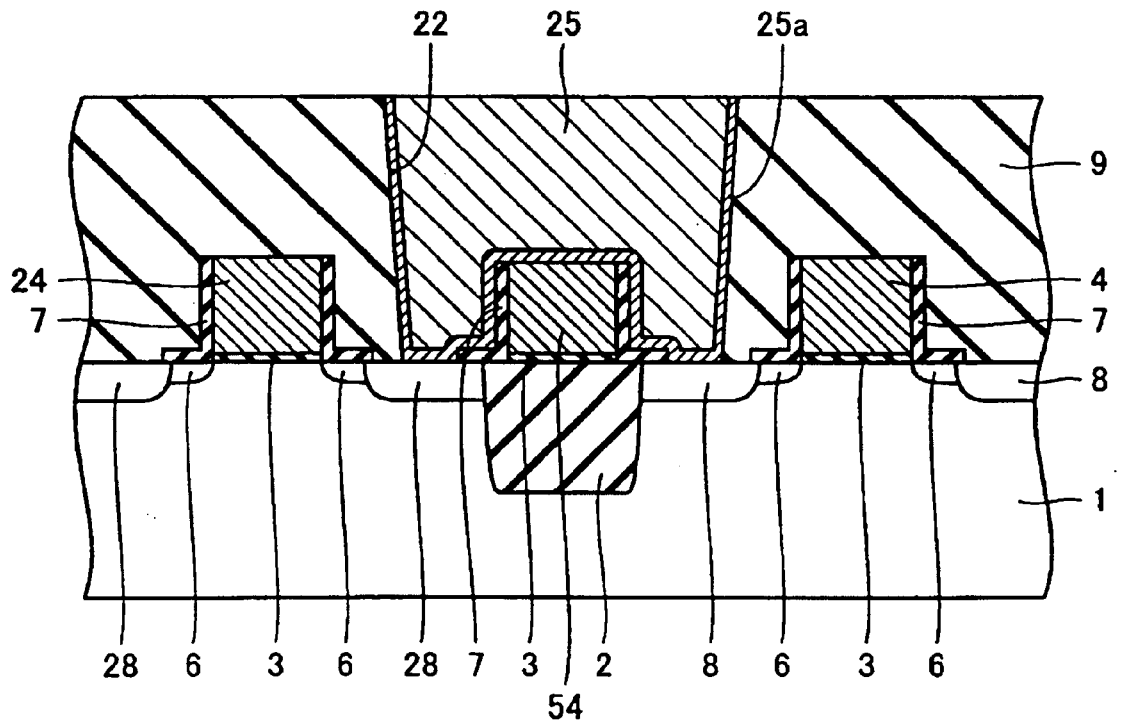
FIG. 18 is a sectional view taken along the line XVIII—XVIII in FIG. 17.

As shown in FIGS. 17 and 18, a multilayer film of a TiN layer of 20 nm and a Ti layer of 20 nm is formed on the bottom wall and the side walls of the contact hole 22 for defining the barrier metal layer 25a. Further, tungsten is deposited by 200 nm through CVD and thereafter polished by CMP thereby forming a tungsten plug 25. The second layer wire 14 is formed by depositing an upper tungsten layer 14 of 100 nm and a lower multilayer film 14a of a TiN layer of 20 nm and a Ti layer of 20 nm and patterning the same.

Thus, the single plug 25 electrically connects the first layer wire 54 with the active regions 8 and 28 located on both sides thereof, so that the resistance of the plug 25 can be reduced. Further, the layout area of a portion rated by the minimum hole interval can be reduced. In addition, no local wire may be provided for connecting two or three contact holes with each other but the single plug 25 can electrically connect the aforementioned three portions with each other. Further, the second layer wire 14 may include no local wire. Consequently, the degree of freedom in layout is increased in an upper layer wire so that layout conditions or the like can be relaxed on extremely narrow pitch portions.

The elements (b1) to (b10) forming the semiconductor device according to this embodiment can be modified as follows, for example. Other modifications are also available within the range of the present invention, as a matter of course.

(b1) Gate Electrode: The gate electrode 4, made of polysilicon in this embodiment, may alternatively be prepared from doped polysilicon. Polysilicide stacked with silicide such as $WSi_2$, $CoSi_2$ or $NiSi_2$ may also be employed as the material for the gate electrode 4. Further, a polymetal stacked with a metal such as W, Al, Ru or Pt or a metal such as W or Al itself may be employed.

(b2) Active Region: The plug wire 25 is directly electrically connected to the $n^+$-conductivity type high-concentration layer of the active region 8 in this embodiment. The surface layer of the active region 8 may alternatively be made of silicide such as $WSi_2$, $CoSi_2$ or $NiSi_2$, in order to reduce electric resistance from the active region 8 to the plug wire 25.

(b3) Plug Wire: The plug wire 25 is made of tungsten in this embodiment. The plug wire 25 may alternatively be made of polycrystalline silicon or a metal such as Al, TiN or Ru.

(b4) Barrier Metal Layer of Plug Wire: The barrier metal layer 25a of the plug wire 25 is formed by CVD, as hereinabove described. Alternatively, the barrier metal layer 25a of the plug wire 25 may be formed by sputtering. When the barrier metal layer 25a of the plug wire 25 is formed by a multilayer film of TiN and Ti through CVD or sputtering, the thicknesses of the Ti layer and the TiN layer are preferably 1 to 100 nm respectively.

(b5) Second Layer Wire: The second layer wire 14 is formed following formation of the plug wire 25 (25a), as hereinabove described. In this case, a tungsten film may be formed after opening the contact hole 22 for forming the second layer wire 14 as such. The second layer wire 14 may not be formed if the gate electrode 4 and the active region 8 are simply connected with each other.

(b6) Insulator Film for Gate Electrode: While the gate electrode 4 is made of polysilicon in this embodiment, an oxide film, a nitride film or a multilayer film of oxide and nitride may be arranged thereon as a hard mask. In this case, the plug wire 25 can be readily electrically connected to the gate electrode 4 by optimizing etching conditions when forming the plug wire 25.

(b7) Interlayer Isolation Film: According to this embodiment, the HDP oxide film is directly formed to cover the gate electrode 4 and the active region 8 for defining the interlayer isolation film 9, followed by opening of the contact hole 22. Alternatively, a nitride film or a multilayer film of nitride and oxide may be formed for thereafter opening the contact hole 22 by etching in an SAC (self align contact) system.

(b8) Element Isolation Film etc.: While the element isolation film 2 and the interlayer isolation film 9 are formed by HDP oxide films in this embodiment, FSG (F-doped silicate glass) films, BPSG films, PSG films, SiOC films, organic films, SiON films, SiC films or SiCF films may alternatively be employed.

(b9) Side Wall Inner-Layer Insulator Film: While the nitride films for defining the side wall inner insulator films 7 are 10 nm in this embodiment, the nitride films may alternatively be 1 to 30 nm. If a large selection ratio can be set when removing the side wall outer-layer spacers 17, oxide films or a multilayer structure of oxynitride films and oxide films may be employed for the side wall insulator films 7.

(b10) Side Wall Outer-Layer Spacer: While the side wall outer-layer spacers 17 are formed by oxide films in this embodiment, PSG (phosphosilicate glass) or BPSG (borophosphosilicate glass) films may alternatively be employed if a large etching selection ratio can be set when removing the side wall outer-layer spacers 17.

(Third Embodiment)

Figure 19:
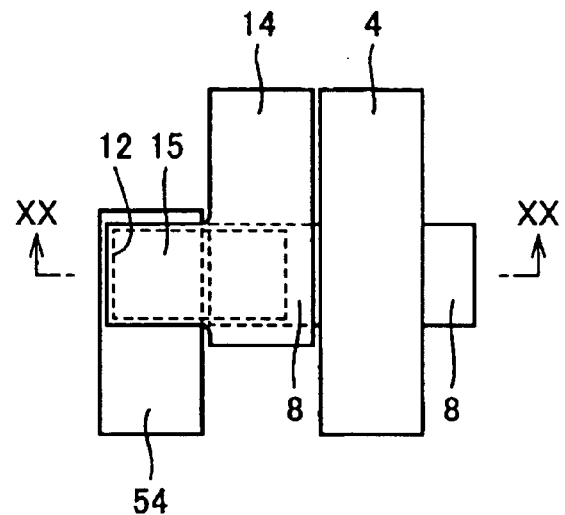
FIG. 19 is a plan view of a semiconductor device according to a third embodiment of the present invention.
Figure 20:
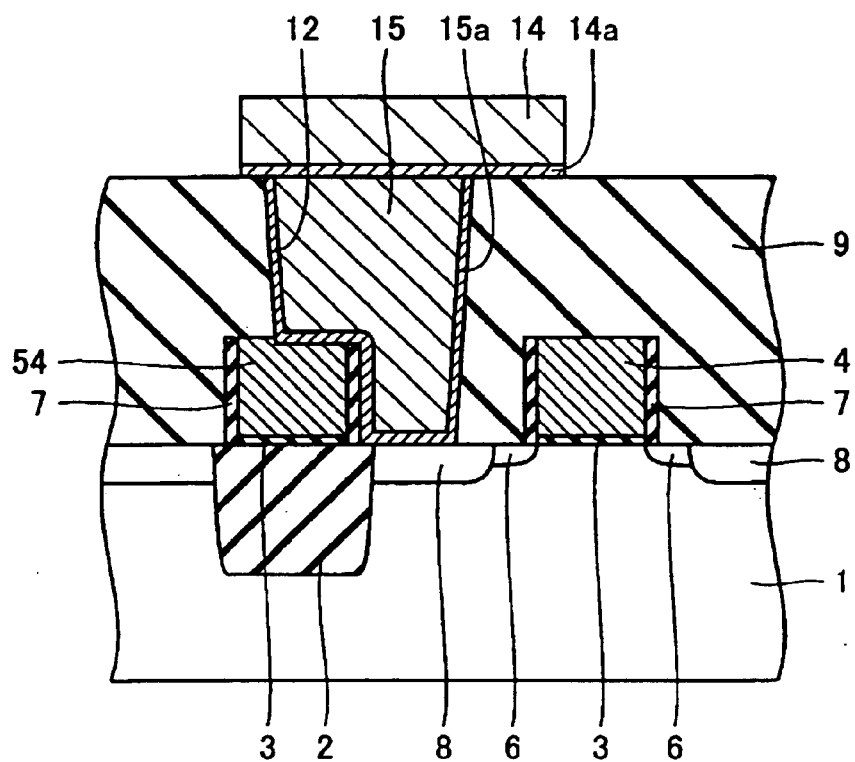
FIG. 20 is a sectional view taken along the line XX—XX in FIG. 19.

FIG. 19 is a plan view of a semiconductor device according to a third embodiment of the present invention, and FIG. 20 is a sectional view taken along the line XX—XX in FIG. 19. The third embodiment is a modification of the first embodiment, and characterized in that I-shaped side wall inner-layer insulator films are applied in place of the L-shaped side wall inner-layer insulator films.

Referring to FIG. 19, an active region 8 is provided on a silicon substrate 1, along with a gate electrode 4 held between the active region 8 and another active region 8 as well as a first layer wire 54 located in parallel with the gate electrode 4. A second layer wire 14 is arranged on a plug 15 electrically connecting the first layer wire 54 and the active region 8 with each other.

Referring to FIG. 20, the silicon substrate 1 is formed by a p-type silicon wafer, for example, and an element isolation film 2 is provided to isolate element regions provided on the silicon wafer from each other. The element isolation film 2 is formed by embedding a plasma oxide film of 300 nm by trench isolation. A gate insulator film 3 consisting of an oxynitride film (SiON) of 3 nm, for example, is provided under the gate electrode 4. The gate electrode 4 is formed by a polysilicon film of 100 nm, and the side surfaces thereof are covered with I-shaped side wall inner-layer insulator films 7. The I-shaped side wall inner-layer insulator films 7 are formed by depositing nitride films by 10 nm and thereafter etching back the same.

An n$^-$-conductivity type low-concentration layer 6 defining an extension is provided on the silicon substrate 1. This n$^-$-conductivity type low-concentration layer 6 is formed by injecting arsenic with acceleration energy of 30 keV and density of 1E14 cm$^{-2}$ at an angle of 45°. An n$^+$-conductivity type low-concentration layer 8 is formed in continuation with the aforementioned extension. The n$^+$-conductivity type low-concentration layer 8 is formed by injecting arsenic with acceleration energy of 50 keV and density of 5E15 cm$^{-2}$. An interlayer isolation film 9 is formed to cover these elements. The interlayer isolation film 9 is formed by depositing an HDP oxide film by 700 nm.

A contact hole 12 is opened in this interlayer isolation film 9, and a plug 15 (15$a$) is formed to fill up the contact hole 12. The plug 15 (15$a$) electrically connects the first layer wire 54 and the active region 8 with each other. A barrier metal layer 15$a$ forming an outer layer of the plug 15 is formed by a composite film consisting of a TiN layer of 20 nm and a Ti layer of 20 nm. A plug body 15 defining the inner layer is formed by embedding tungsten by CVD for forming a tungsten plug. A second layer wire 14 (14$a$) is provided to be electrically connected to the plug 15 (15$a$). The second layer wire 14 (14$a$) is formed by an upper tungsten layer 14 of 100 nm and a lower multilayer film 14$a$ consisting of a TiN layer of 20 nm and a Ti layer of 20 nm.

A method of fabricating the semiconductor device according to this embodiment is now described with reference to FIGS. 21 to 27.

Figure 21:
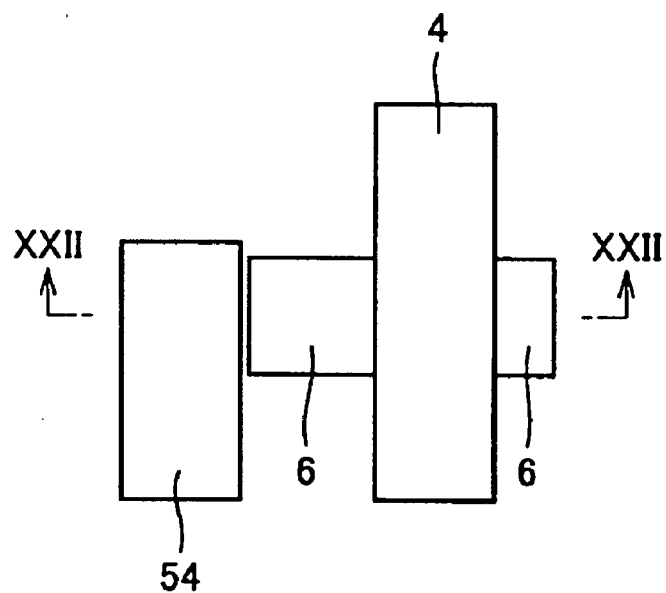
FIG. 21 is a plan view in a stage of forming a gate electrode and a low-concentration impurity layer in fabrication of the semiconductor device shown in FIG. 19.
Figure 22:
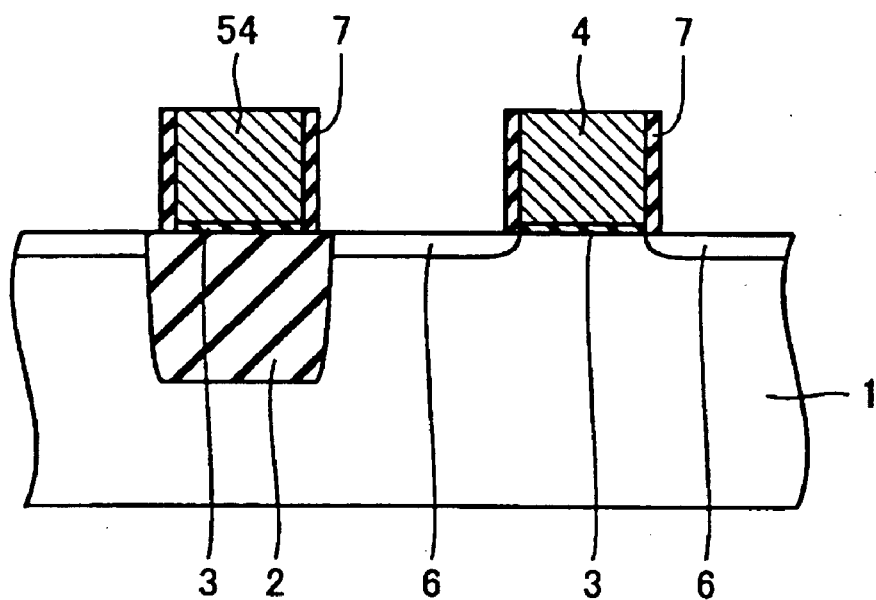
FIG. 22 is a sectional view taken along the line XXII—XXII in FIG. 21.

As shown in FIGS. 21 and 22, the trench isolation film 2 of 300 nm is formed on the silicon substrate 1 by STI. Then, an oxynitride film (SiON film) is formed by 3 nm as the gate insulator film 3, followed by formation of the gate electrode 4 and the first layer wire 54. In this case, non-doped polysilicon is deposited by 100 nm and phosphorus (P$^+$), for example, is implanted into an n-conductivity type region with acceleration energy of 10 keV and concentration of 5E15 cm$^{-2}$ through a resist mask. Similarly, boron (B$^+$), for example, is implanted into a p-conductivity type region with acceleration energy of 3 keV and concentration of 5E15 cm$^{-2}$ through a resist mask. Further, dry etching is performed through the resist masks for finishing a conductive layer part. Thereafter nitride films of 10 nm are formed and etched back thereby forming the I-shaped side wall inner-layer insulator films 7 on the side surfaces of the aforementioned conductive layer. Then, arsenic (As$^+$) is implanted with acceleration energy of 30 keV and concentration of 1E14 cm$^{-2}$ at an angle of 45° thereby forming the n-conductivity type low-concentration layer 6 defining the extension.

Figure 23:
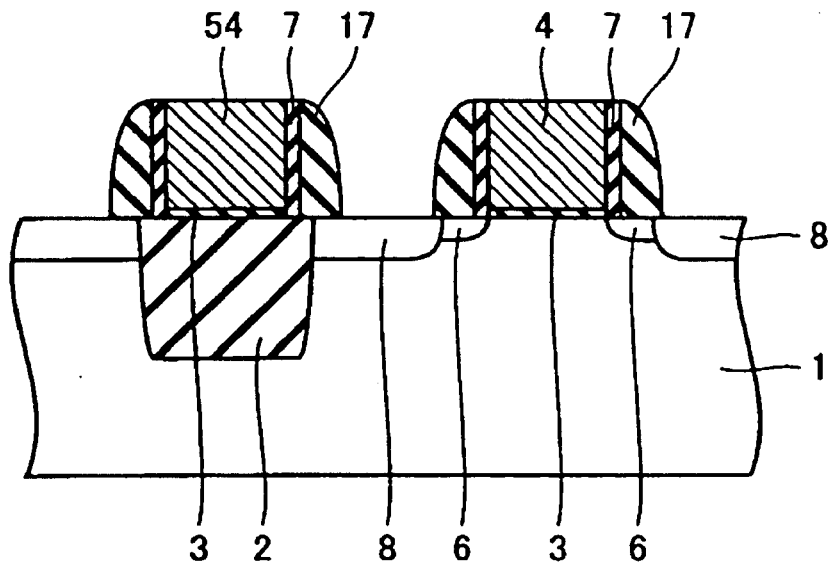
FIG. 23 is a sectional view in a stage of forming a high-concentration impurity layer through side wall insulator films employed as masks.

Then, BPSG films are deposited by 80 nm and etched back thereby forming the side wall outer-layer spacers 17, as shown in FIG. 23. Further, arsenic is implanted with acceleration energy of 50 keV and concentration of 5E15 cm$^{-2}$ thereby forming the n$^+$-conductivity type high-concentration layer 8.

Figure 24:
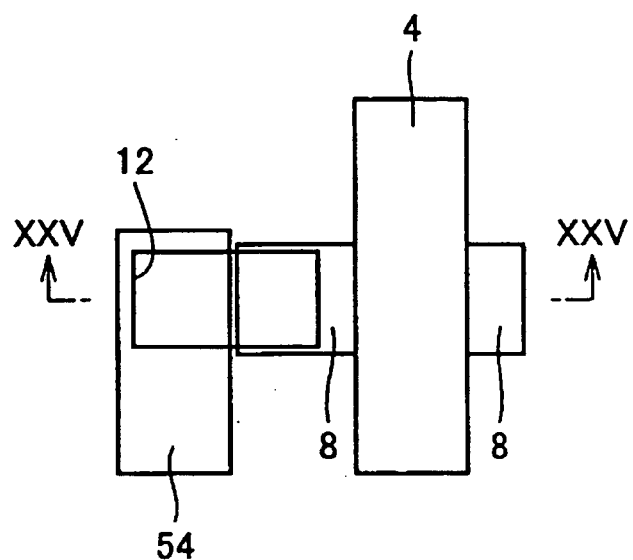
FIG. 24 is a plan view in a stage of opening a contact hole in the interlayer isolation film.
Figure 25:
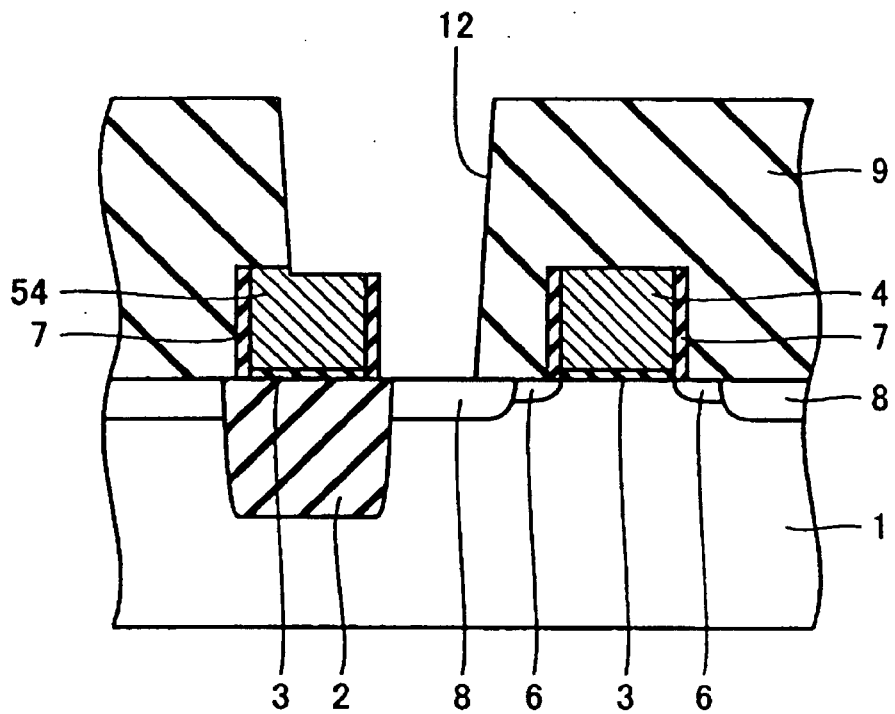
FIG. 25 is a sectional view taken along the line XXV—XXV in FIG. 24.
Figure 26:
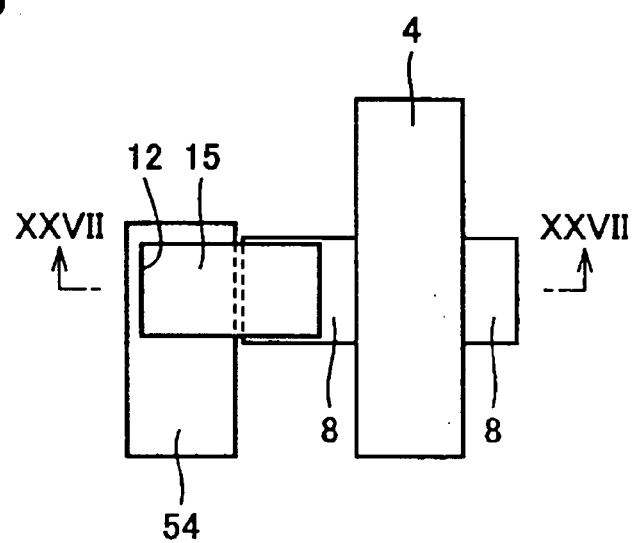
FIG. 26 is a plan view in a stage of forming a conductive layer for a plug in the contact hole.
Figure 27:
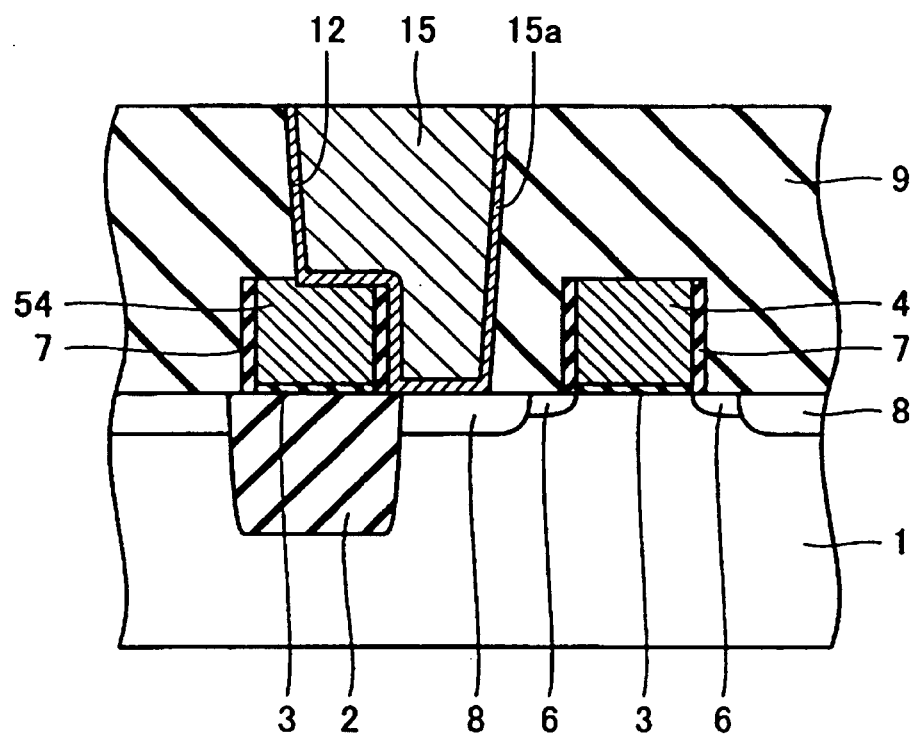
FIG. 27 is a sectional view taken along the line XXVII—XXVII in FIG. 26.

Then, only the BPSG side wall outer-layer spacers 17 are removed by a vapor phase fluoric acid method. At this time, the side wall inner insulator films 7 are left in I shapes, not to be etched. Then, an HDP oxide film is deposited by 1000 nm and polished by 300 nm by CMP, for forming the interlayer isolation film 9. Then, the contact hole 12 is opened in a diameter of 0.2 µm by dry etching through a resist mask, as shown in FIGS. 24 and 25. This dry etching is performed under conditions for attaining sufficiently high etching selection ratios between the first layer wire 54 having a similar structure to the gate electrode 4 and the n$^+$-conductivity type high-concentration layer 8 and the interlayer isolation film 9.

Then, the plug 15 is formed to fill up the contact hole 12. The barrier metal layer 15$a$ of the plug 15 is formed by a TiN layer of 20 nm in thickness and a Ti layer of 20 nm in thickness. Tungsten is deposited on the inner side of the barrier metal layer 15$a$ in a thickness of 200 nm by CVD and polished by CMP, thereby forming the tungsten plug 15. Then, a multilayer film of the upper tungsten layer 14 of 100 nm and the lower multilayer film 14$a$ consisting of the Tin layer of 20 nm and the Ti layer of 20 nm are formed and patterned into the second layer wire 14.

Thus, the plug 15 connects active region 8 and the first layer wire 54 with each other, whereby the resistance of the plug 15 can be reduced and the layout area of a portion generally rated at a contact hole pitch can be reduced.

The I-shaped side wall inner-layer insulator films 7 are applied to be capable of ensuring a smaller contact area on the bottom surface of the contact hole 12 connected to the active region 8 of the substrate 1 as compared with L-shaped side wall inner-layer insulator films. Consequently, contact resistance can be reduced. Also as to a transistor, gate overlap capacity can be reduced for further increasing the speed of a circuit.

The elements (c1) to (c10) forming the semiconductor device according to this embodiment can be modified as follows, for example. Other modifications are also available within the range of the present invention, as a matter of course.

(c1) Gate Electrode: The gate electrode 4, made of polysilicon in this embodiment, may alternatively be prepared from doped polysilicon. Polysilicide stacked with silicide such as $WSi_2$, $CoSi_2$ or $NiSi_2$ may also be employed as the material for the gate electrode 4. Further, a polymetal stacked with a metal such as W, Al, Ru or Pt or a metal such as W or Al itself may be employed.

(c2) Active Region: The plug wire 15 is directly electrically connected to the $n^+$-conductivity type high-concentration layer of the active region 8 in this embodiment. The surface layer of the active region 8 may alternatively be made of silicide such as $WSi_2$, $CoSi_2$ or $NiSi_2$, in order to reduce electric resistance from the active region 8 to the plug wire 15.

(c3) Plug Wire: The plug wire 15 is made of tungsten in this embodiment. The plug wire 15 may alternatively be made of polycrystalline silicon or a metal such as Al, TiN or Ru.

(c4) Barrier Metal Layer of Plug Wire: The barrier metal layer 15a of the plug wire 15 is formed by CVD, as hereinabove described. Alternatively, the barrier metal layer 15a of the plug wire 15 may be formed by sputtering. When the barrier metal layer 15a of the plug wire 15 is formed by a multilayer film of TiN and Ti through CVD or sputtering, the thicknesses of the Ti layer and the TiN layer are preferably 1 to 100 nm respectively.

(c5) Second Layer Wire: The second layer wire 14 is formed following formation of the plug wire 15 (15a), as hereinabove described. In this case, a tungsten film may be formed after opening the contact hole 12 for forming the second layer wire 14 as such. The second layer wire 14 may not be formed if the gate electrode 4 and the active region 8 are simply connected with each other.

(c6) Insulator Film for Gate Electrode: While the gate electrode 4 is made of polysilicon in this embodiment, an oxide film, a nitride film or a multilayer film of oxide and nitride may be arranged thereon as a hard mask. In this case, the plug wire 15 can be readily electrically connected to the gate electrode 4 by optimizing etching conditions when forming the plug wire 15.

(c7) Interlayer Isolation Film: According to this embodiment, the HDP oxide film is directly formed to cover the gate electrode 4 and the active region 8 for defining the interlayer isolation film 9, followed by opening of the contact hole 12. Alternatively, a nitride film or a multilayer film of nitride and oxide may be formed for thereafter opening the contact hole 12 by etching in an SAC (self align contact) system.

(c8) Element Isolation Film etc.: While the element isolation film 2 and the interlayer isolation film 9 are formed by HDP oxide films in this embodiment, FSG (F-doped silicate glass) films, BPSG films, PSG films, SiOC films, organic films, SiON films, SiC films or SiCF films may alternatively be employed.

(c9) Side Wall Inner-Layer Insulator Film: While the nitride films for defining the side wall inner insulator films 7 are 10 nm in this embodiment, the nitride films may alternatively be 1 to 50 nm. If a large selection ratio can be set when removing the side wall outer-layer spacers 17, oxide films or a multilayer structure of oxynitride films and oxide films may be employed for the side wall insulator films 7.

(c10) Side Wall Outer-Layer Spacer: While the side wall outer-layer spacers 17 are formed by BPSG films in this embodiment, insulator films such as PSG, NSG, PTEOS, BPTEOS or TEOS films may alternatively be employed if a large etching selection ratio can be set when removing the side wall outer-layer spacers 17.

(Fourth Embodiment)

Figure 28:
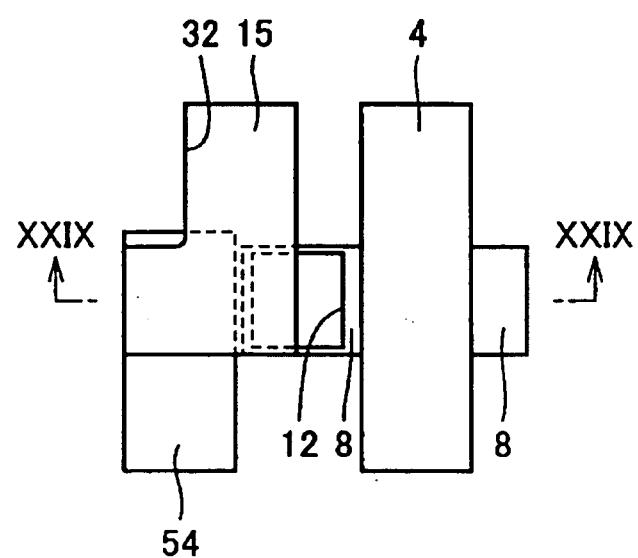
FIG. 28 is a plan view of a semiconductor device according to a fourth embodiment of the present invention.
Figure 29:
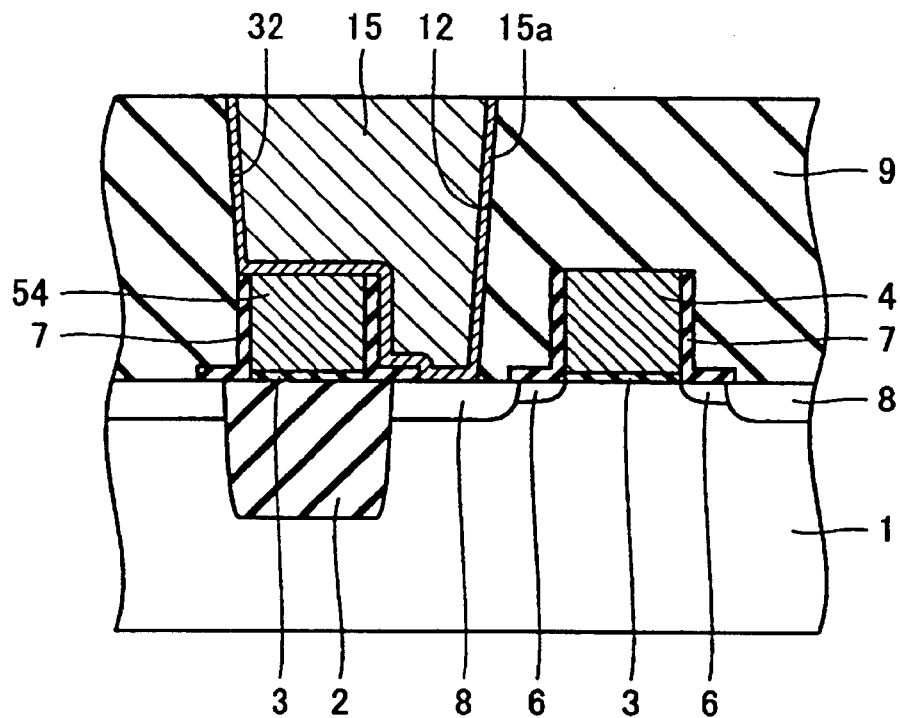
FIG. 29 is a sectional view taken along the line XXIX—XXIX in FIG. 28.
Figure 30:
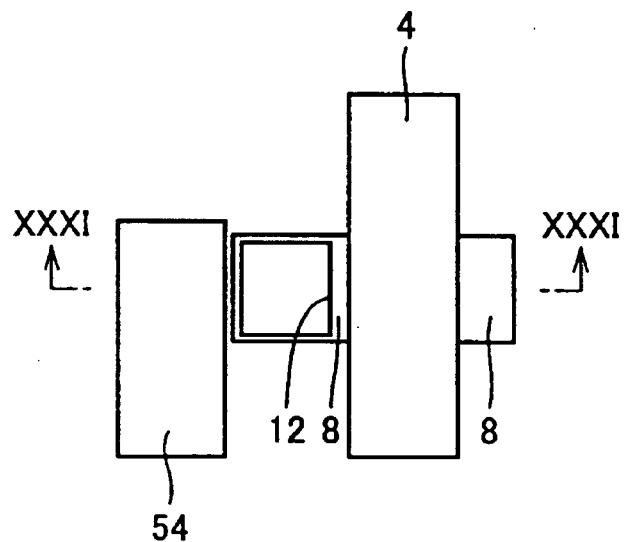
FIG. 30 is a plan view in a stage of forming a first contact hole in an interlayer isolation film in fabrication of the semiconductor device shown in FIG. 28.

FIG. 28 is a plan view of a semiconductor device according to a fourth embodiment of the present invention. FIG. 29 is a sectional view taken along the line XXIX—XXIX in FIG. 28. The fourth embodiment is a modification of the first embodiment, and characterized in that a dual damascene fabrication flow is employed for opening a contact hole.

Referring to FIG. 28, an active region 8 is provided on a silicon substrate 1, and a gate electrode 4 is provided between the active region 8 and another active region 8. A first layer wire 54 is provided in parallel with the gate electrode 4. A plug 15 electrically connects the first layer wire 54 and the active region 8 with each other to fill up two contact holes 12 and 32. Either one of the two contact holes 12 and 32 is properly referred to as a wiring trench, and hence the contact hole 32 may also be referred to as a wiring trench 32. Either the contact hole 12 or the wiring trench 32 may be opened in advance.

Referring to FIG. 29, the silicon substrate 1 is a p-type silicon wafer provided with an element isolation film 2 isolating element regions formed on the silicon substrate 1 with each other. The element isolation film 2 is formed by embedding a plasma oxide film of 300 nm by trench isolation. An oxynitride film (SiON film) of 3 nm is formed as a gate insulator film 3, and a gate electrode 4 is provided thereon. The gate electrode 4 is formed by a polysilicon film of 100 nm. An $n^-$-conductivity type low-concentration layer 6 defining an extension is formed by injecting arsenic (As) with acceleration energy of 30 keV and density of 1E14 $cm^{-2}$ at an angle of 45°.

In parallel with the step of forming the gate electrode 4, the first layer wire 54 having the same structure as the gate electrode 4 is formed on the element isolation film 2. Therefore, side wall insulator films covering the side surfaces of the gate electrode 4 are also formed on the side surfaces of the first layer wire 54, as described below.

Side wall inner-layer insulator films 7 are formed on the side surfaces of the gate electrode 4 by depositing nitride films by 10 nm and thereafter working the same to have L-shaped sections. An $n^+$-conductivity type high-concentration layer in continuation with the extension is formed by injecting arsenic with acceleration energy of 50 keV and density of 5E15 $cm^{-2}$. An interlayer isolation film 9 is formed to cover these elements by depositing an HDP oxide film by 700 nm.

The two contact holes 12 and 32 or the contact hole 12 and the wiring trench 32 are opened in the interlayer isolation film 9, and the plug 15 is formed to fill up the same. The plug 15 electrically connects the first layer wire 54 having the same structure as the gate electrode 4 and the active region 8 with each other. A barrier metal layer 15a of the plug 15 is formed by a TaN layer of 20 nm and a Ta layer of 20 nm by CVD. Copper (Cu) is embedded in this barrier metal layer 15a by plating, for forming a Cu dual damascene structure.

Thus, the Cu dual damascene plug 15 connects the active region 8 and the first layer wire 54 with each other, whereby the electric resistance of the plug 15 can be reduced. Further, the layout area of a portion generally rated at a hole pitch can be reduced.

A method of fabricating the semiconductor device according to this embodiment is now described with reference to FIGS. 30 to 33.

First, the element isolation film 2 of 300 nm is formed on the silicon substrate 1 by STI. Then, an oxynitride film (SiON film) of 3 nm is formed as the gate insulator film 3. Non-doped polysilicon is deposited by 100 nm for forming the gate electrode 4 on the gate insulator film 3. Phosphorus ($P^+$) is implanted into an n-conductivity type region with acceleration energy of 10 keV and density of 5E15 $cm^{-2}$ through a resist mask. Similarly, boron ($B^+$) is implanted into a p-conductivity type region with acceleration energy of 3 keV and density of 5E15 $cm^{-2}$. Thereafter dry etching is performed through a resist mask thereby forming the gate electrode 4 and the first layer wire 54. Further, the $n^-$—conductivity type low-concentration layer 6 defining the extension is formed by injecting arsenic ($As^+$) with acceleration energy of 30 keV and density of 1E14 $cm^{-2}$ at an angle of 45°.

In parallel with this step of forming the gate electrode 4, the first layer wire 54 having the same structure as the gate electrode 4 is formed on the element isolation film 2. The side wall inner-layer insulator films 7 and side wall outer-layer spacers are formed on the side surfaces of the first layer wire 54 as described below, and the side wall outer-layer spacers are removed after injection of an impurity.

Following formation of the $n^-$-conductivity type low-concentration layer 6, nitride films are formed by 100 nm to cover the side surfaces of the gate electrode 4 and portions of the silicon substrate 1 located on the bases thereof as the side wall inner-layer insulator films 7. Then, the side wall outer-layer spacers are formed by depositing oxide films 17 by 80 nm and etching back the same. The side wall inner-layer insulator films 7 and the side wall outer-layer spacers are employed as masks for forming an $n^+$-conductivity type high-concentration layer 8 by injecting arsenic with acceleration energy of 50 keV and density of 5E15 $cm^{-2}$.

Figure 31:
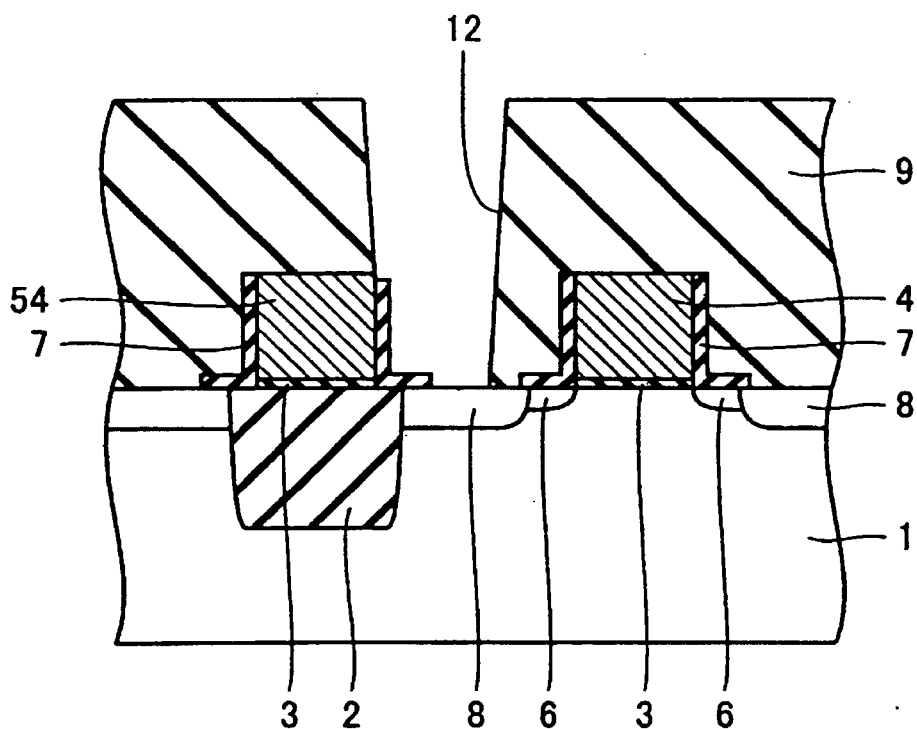
FIG. 31 is a sectional view taken along the line XXXI—XXXI in FIG. 30.

As shown in FIG. 31, the interlayer isolation film 9 is formed by depositing an HDP oxide film by 1000 nm and polishing the same by 300 nm by CMP. Then, the first contact hole 12 having a diameter of 0.2 $\mu$m is formed by performing dry etching through a resist mask (see FIGS. 30 and 31). The first contact hole 12 is opened to reach the active region 8. At this time, the $n^+$-conductivity type high-concentration layer 8 and the interlayer isolation film 9 are etched under conditions having sufficiently high etching selection ratios.

Figure 32:
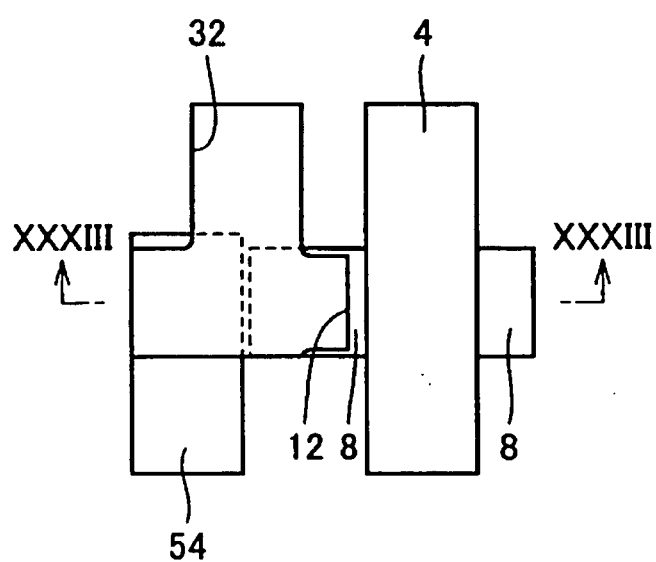
FIG. 32 is a plan view in a stage of forming a second contact hole in the interlayer isolation film in fabrication of the semiconductor device shown in FIG. 28.
Figure 33:
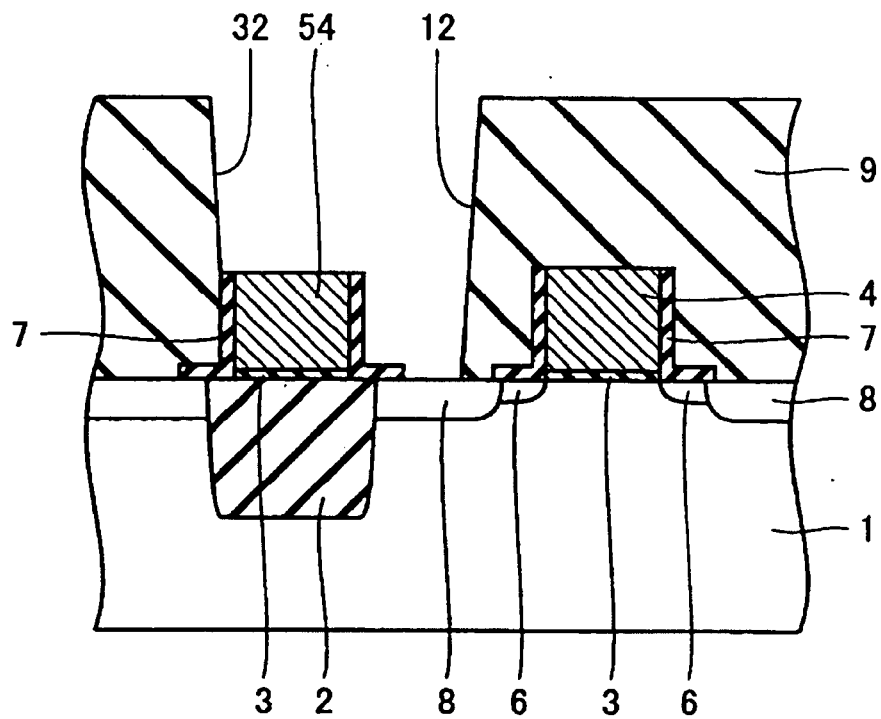
FIG. 33 is a sectional view taken along the line XXXIII—XXXIII in FIG. 32.

As shown in FIGS. 32 and 33, the trench 32 defining a second contact hole is formed by dry etching through a resist mask. The second contact hole 32 is opened to reach the first layer wire 54. At this time, the $n^+$-conductivity type high-concentration layer 8, the first layer wire 54 and the interlayer isolation film 9 are etched under conditions for attaining sufficiently high etching selection ratios.

Then, the barrier metal layer 15a of the plug 15 is formed by depositing the TaN layer of 20 nm in thickness and the Ta layer of 20 nm in thickness by CVD, as shown in FIG. 29. Copper is deposited inside the barrier metal layer 15a by plating in a thickness of 400 nm and polished by CMP, for forming the Cu dual damascene plug 15.

Thus, the Cu dual damascene plug 15 (15a) electrically connects the active region 8 and the first layer wire 54 with each other, whereby the electric resistance of the plug 15 can be reduced. Further, the layout area of a portion generally rated at a hole pitch can be reduced.

The elements (d1) to (d10) forming the semiconductor device according to this embodiment can be modified as follows, for example. Other modifications are also available within the range of the present invention, as a matter of course.

(d1) Gate Electrode: The gate electrode 4, made of polysilicon in this embodiment, may alternatively be prepared from doped polysilicon. Polysilicide stacked with silicide such as $WSi_2$, $CoSi_2$ or $NiSi_2$ may also be employed as the material for the gate electrode 4. Further, a polymetal stacked with a metal such as W, Al, Ru or Pt or a metal such as W or Al itself may be employed.

(d2) Active Region: The plug wire 15 is directly electrically connected to the $n^+$-conductivity type high-concentration layer of the active region 8 in this embodiment. The surface layer of the active region 8 may alternatively be made of silicide such as $WSi_2$, $CoSi_2$ or $NiSi_2$, in order to reduce electric resistance from the active region 8 to the plug wire 15.

(d3) Plug Wire: The plug wire 15 made of Cu in the aforementioned embodiment may alternatively be made of polycrystalline silicon or a metal such as Al, TiN or Ru.

(d4) Barrier Metal Layer of Plug Wire: The barrier metal layer 15a of the plug wire 15, formed by CVD in the aforementioned embodiment, may alternatively be formed by sputtering. Further, the barrier metal layer 15a may be prepared from Ta, TaN, WN, WSiN, Ti, TiN or a multilayer structure of any of these materials.

(d5) Second Layer Wire: The second layer wire 14 is formed following formation of the plug wire 15 (15a), as hereinabove described. In this case, a tungsten film may be formed after opening the contact hole 12 for forming the second layer wire 14 as such. The second layer wire 14 may not be formed if the gate electrode 4 and the active region 8 are simply connected with each other.

(d6) Upper Layer Insulator Film for Gate Electrode: While the gate electrode 4 is made of polysilicon in this embodiment, an oxide film, a nitride film or a multilayer film of oxide and nitride may be arranged thereon as a hard mask. In this case, the plug wire 15 can be readily electrically connected to the gate electrode 4 by optimizing etching conditions when forming the plug wire 15.

(d7) Interlayer Isolation Film: According to this embodiment, the HDP oxide film is directly formed to cover the gate electrode 4 and the active region 8 for defining the interlayer isolation film 9, followed by opening of the contact hole 12. Alternatively, a nitride film or a multilayer film of nitride and oxide may be formed for thereafter opening the contact hole 12 by etching in an SAC (self align contact) system.

(d8) Element Isolation Film etc.: While the element isolation film 2 and the interlayer isolation film 9 are formed by HDP oxide films in this embodiment, FSG (F-doped silicate glass) films, BPSG films, PSG films, SiOC films, organic films, SiON films, SiC films or SiCF films may alternatively be employed.

(d9) Side Wall Inner-Layer Insulator Film: While the nitride films for defining the side wall inner insulator films 7 are 10 nm in this embodiment, the nitride films may alternatively be 1 to 50 nm. If a large selection ratio can be set when removing the side wall outer-layer spacers 17, oxide films or a multilayer structure of oxynitride films and oxide films may be employed for the side wall insulator films 7.

(d10) Side Wall Outer-Layer Spacer: While the side wall outer-layer spacers are formed by oxide films in this embodiment, PSG (phosphosilicate glass) or BPSG (borophosphosilicate glass) films may alternatively be employed if a large etching selection ratio can be set when removing the side wall outer-layer spacers.

(Fifth Embodiment)

Figure 34:
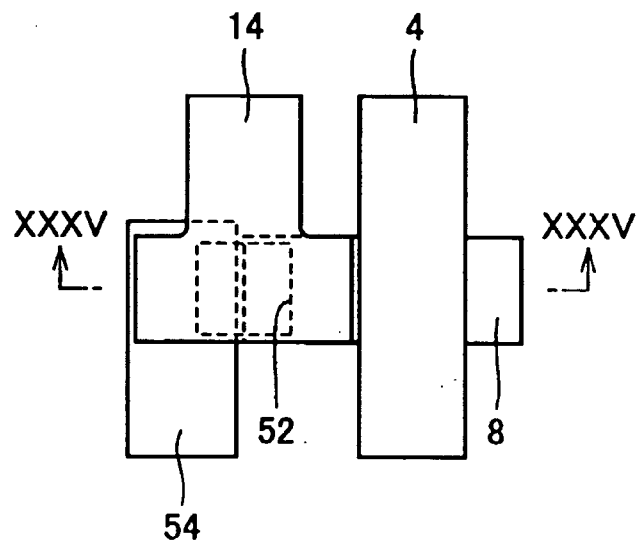
FIG. 34 is a plan view of a semiconductor device according to a fifth embodiment of the present invention.

FIG. 34 is a plan view of a semiconductor device according to a fifth embodiment of the present invention, and FIG.

35 is a sectional view taken along the line XXXV—XXXV in FIG. 34. This embodiment is a modification of the first embodiment, and characterized in that wet etching and dry etching are combined with each other for opening a contact hole 52.

Referring to FIG. 34, an active region 8 is provided on a silicon substrate 1, and a gate electrode 4 is provided to be held between the active region 8 and another active region 8. A first layer wire 54 is provided on the same layer as the gate electrode 4. A plug 15 is electrically connected to the first layer wire 54 and the active region 8 to fill up the contact hole 52 opened by the aforementioned etching.

Figure 35:
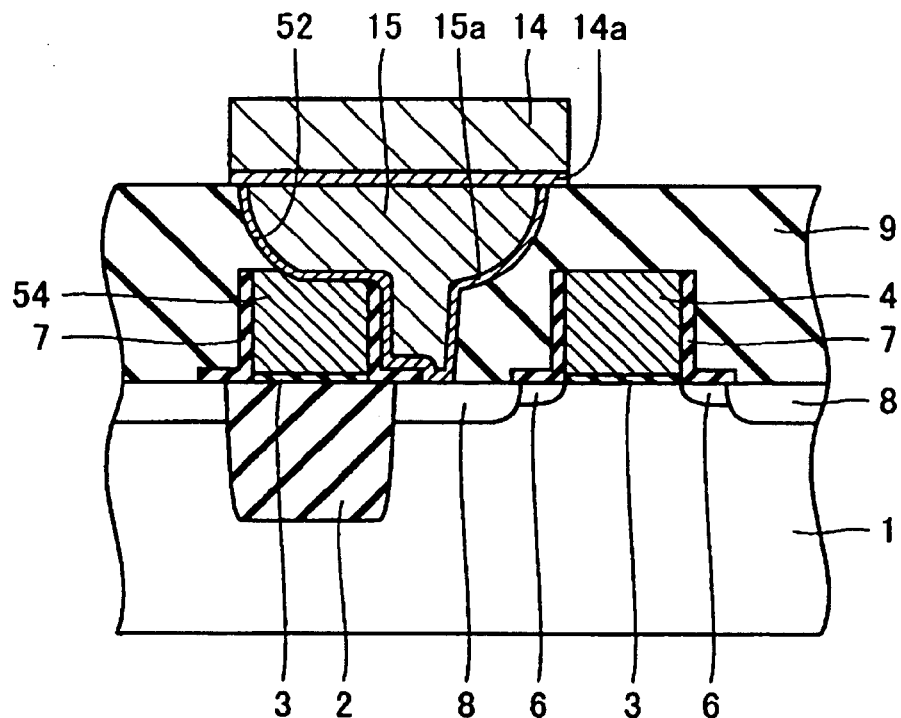
FIG. 35 is a sectional view taken along the line XXXV—XXXV in FIG. 32.

Referring to FIG. 35, the silicon substrate 1 is a p-type silicon wafer provided with an element isolation film 2. This element isolation film 2 is formed by embedding a plasma oxide film of 300 nm by trench isolation. The gate electrode 4 is arranged on a gate oxide film 3 formed by an oxynitride film (SiON film) of 9 nm. The gate electrode 4 is formed by a polysilicon film of 100 nm. L-shaped insulator films 7 are formed by depositing nitride films by 10 nm to cover the side surfaces of the gate electrode 4 and parts of the silicon substrate 1 located on the bases thereof. The gate electrode 4 and the first layer wire 54 have the same sectional structure.

An $n^+$-conductivity type high-concentration layer 8 forming the active region of a transistor is formed by injecting arsenic with acceleration energy of 50 keV and density of 5E15 $cm^{-2}$. An interlayer isolation film 9 is formed to cover these elements by depositing an HDP oxide film by 500 nm. The contact hole 52 is opened in the interlayer isolation film 9. The plug 15 (15a) filling up the contact hole 52 electrically connects the gate electrode 4 and the active region 8 with each other. A barrier metal layer 15a of the plug 15 is formed by a multilayer structure consisting of a TiN layer of 20 nm and a Ti layer of 20 nm. Tungsten is embedded inside the barrier metal layer 15a by CVD, for forming the tungsten plug 15. A second layer wire 14 having an upper tungsten layer of 100 nm and a lower layer 14a consisting of a multilayer film of a TiN layer of 20 nm and a Ti layer of 20 nm is formed to be in contact with the plug 15.

Thus, the plug 15 (15a) electrically connects the active region 8 and the first layer wire 54 with each other, whereby the electric resistance of the plug 15 can be reduced. Further, the layout area of a portion generally rated at a contact hole pitch can be reduced.

Figure 36:
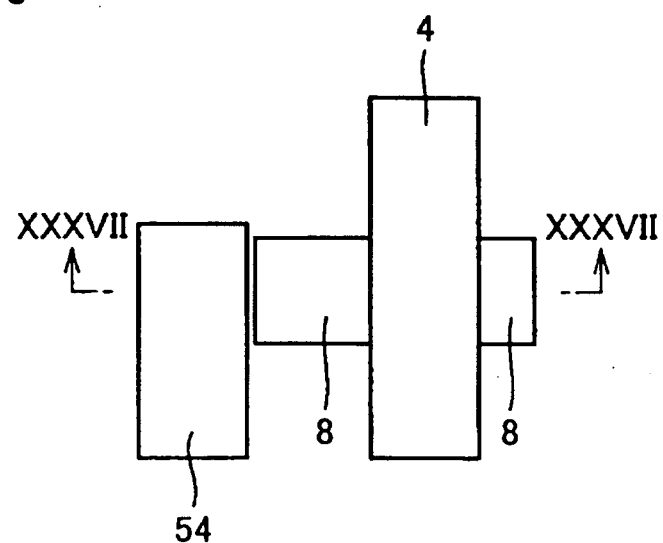
FIG. 36 is a sectional view in a stage of forming a high-concentration impurity layer through side wall insulator films employed as masks.
Figure 37:
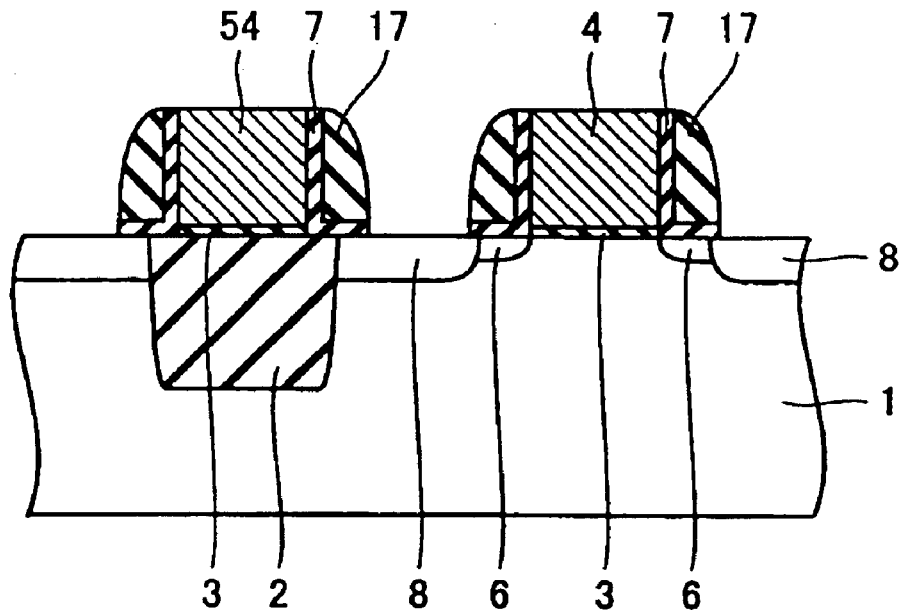
FIG. 37 is a sectional view taken along the line XXXVII—XXXVII in FIG. 36.

A method of fabricating the semiconductor device according to this embodiment is now described with reference to FIGS. 36 to 42. As shown in FIGS. 36 and 37, the element isolation film 2 of 300 nm is formed on the silicon substrate 1 by STI. Then, the gate oxide film 3 of an oxynitride film (SiON film), for example, is formed by 3 nm. Then, non-doped polysilicon is deposited by 100 nm for forming the gate electrode 4, and phosphorus ($P^+$) is implanted into an n-conductivity type region with acceleration energy of 10 keV and density of 5E15 $cm^{-2}$. Similarly, boron ($B^+$) is implanted into a p-conductivity type region with acceleration energy of 3 keV and density of 5E15 $cm^{-2}$. Thereafter the gate electrode 4 is formed by dry etching through a resist mask. At this time, the first layer wire 54 is simultaneously formed on the element isolation film 2, as a matter of course.

Then, an $n^-$-conductivity type low-concentration layer 6 defining an extension is formed by injecting arsenic ($As^+$) with acceleration energy of 30 keV and density of 1E14 $cm^{-2}$ at an angle of 45°.

Figure 38:
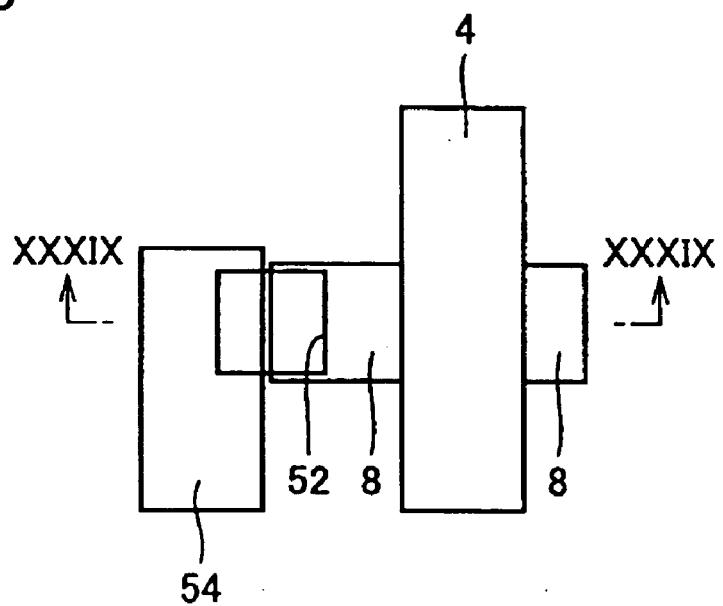
FIG. 38 is a plan view in a stage of opening a first contact hole in an interlayer isolation film in fabrication of the semiconductor device shown in FIG. 36.
Figure 39:
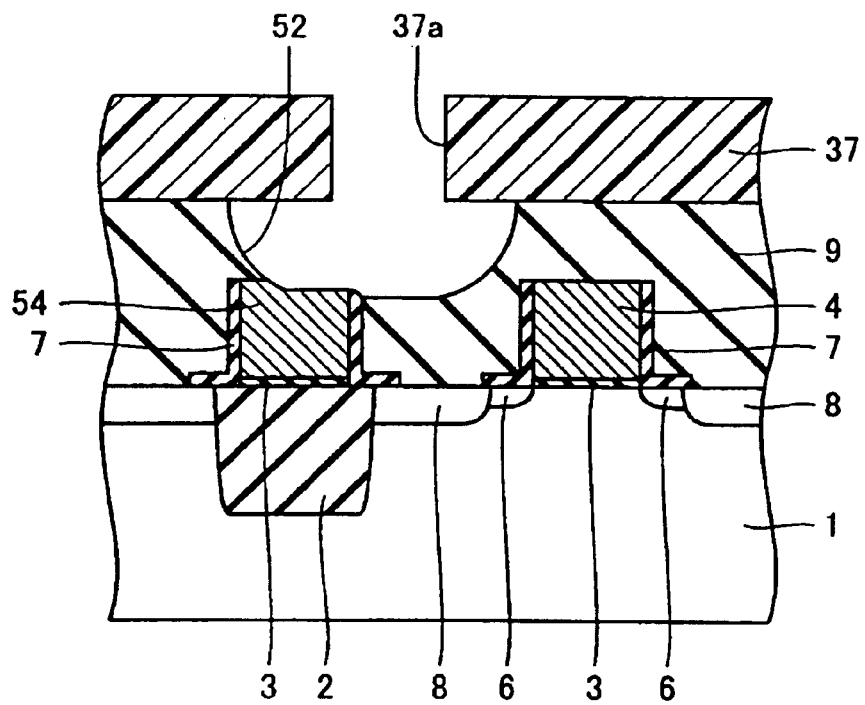
FIG. 39 is a sectional view taken along the line XXXIX—XXXIX in FIG. 38.

Then, nitride films are formed by 10 nm as side wall inner-layer insulator films 7, and oxide films are deposited thereon by 80 nm and etched back for forming side wall outer-layer spacers 17. Further, the $n^+$-conductivity type high-concentration layer 8 is formed by injecting arsenic with acceleration energy of 50 keV and density of 5E15 $cm^{-2}$. Then, only the side wall outer-layer spacers 17 are removed by wet etching, as shown in FIGS. 38 and 39.

Then, an HDP oxide film is deposited by 1000 nm and polished by 500 nm by CMP, for forming the interlayer isolation film 9. The contact hole 52 of 0.2 μm in diameter is opened by wet etching through a resist mask 37. In this wet etching, a chemical penetrates through an opening 37a of the resist mask 37 for forming an opening in the interlayer isolation film 9 in a sectional shape shown in FIG. 39. At this time, the first layer wire 54 and the interlayer isolation film 9 are etched under conditions for attaining sufficiently high etching selection ratios.

Figure 40:
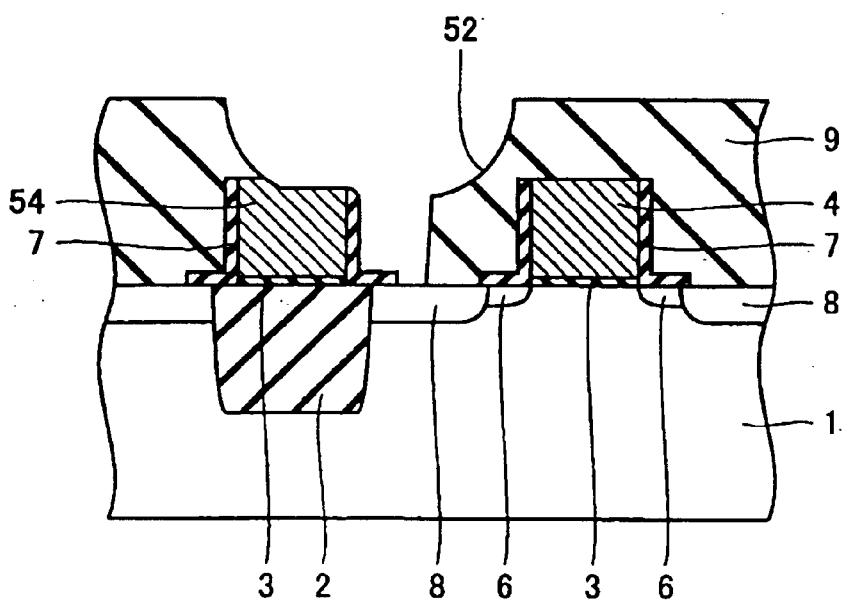
FIG. 40 is a plan view in a stage of opening a second contact hole in the interlayer isolation film in fabrication of the semiconductor device shown in FIG. 36.

Then, the resist mask 37 is employed as such for forming the contact hole 52 by dry etching (see FIG. 40). At this time, the first layer wire 54 and the $n^+$-conductivity type high-concentration layer 8 and the interlayer isolation film 9 are etched under conditions for attaining sufficiently high etching selection ratios.

Figure 41:
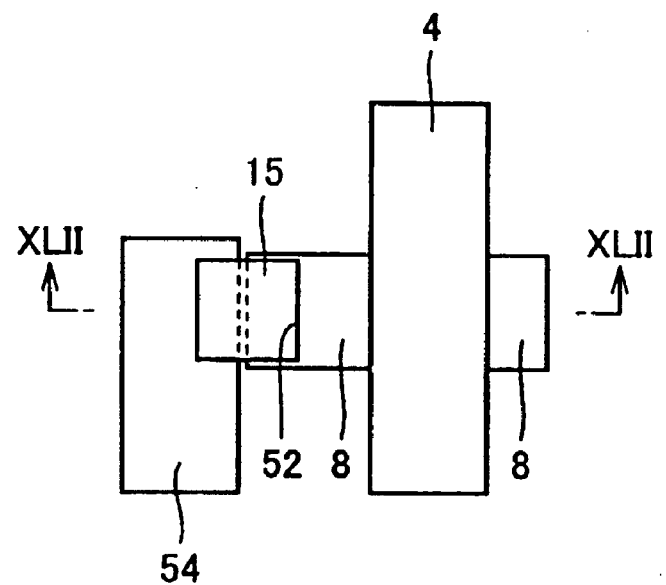
FIG. 41 is a plan view in a stage of forming a conductive layer for a plug in the contact hole.
Figure 42:
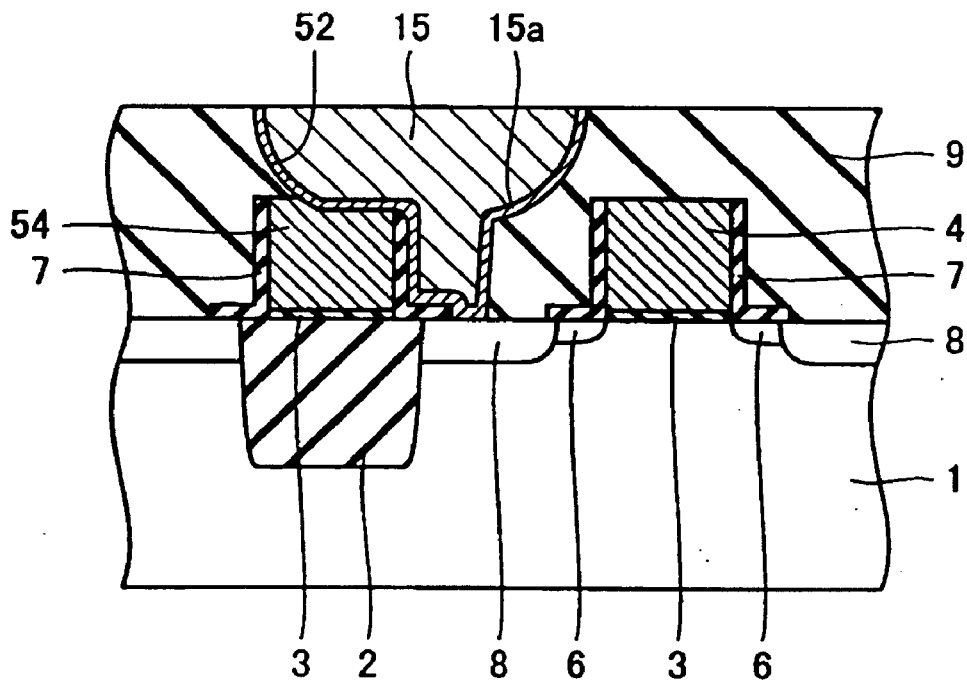
FIG. 42 is a sectional view taken along the line XLII—XLII in FIG. 41.
Figure 43:
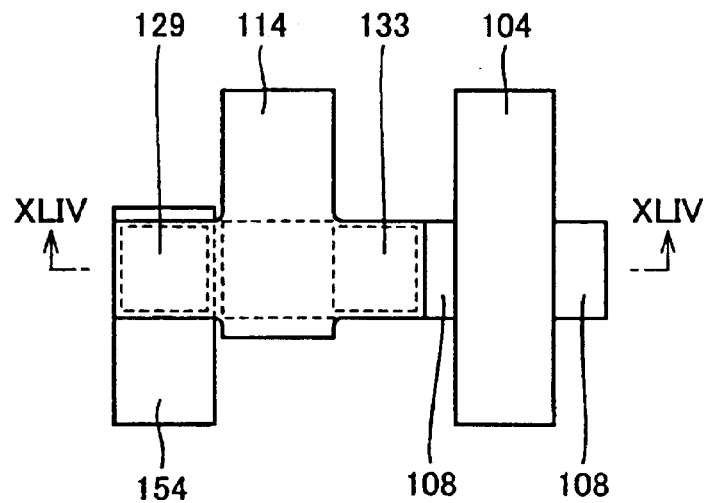
FIG. 43 is a plan view showing a conventional semiconductor device.
Figure 44:
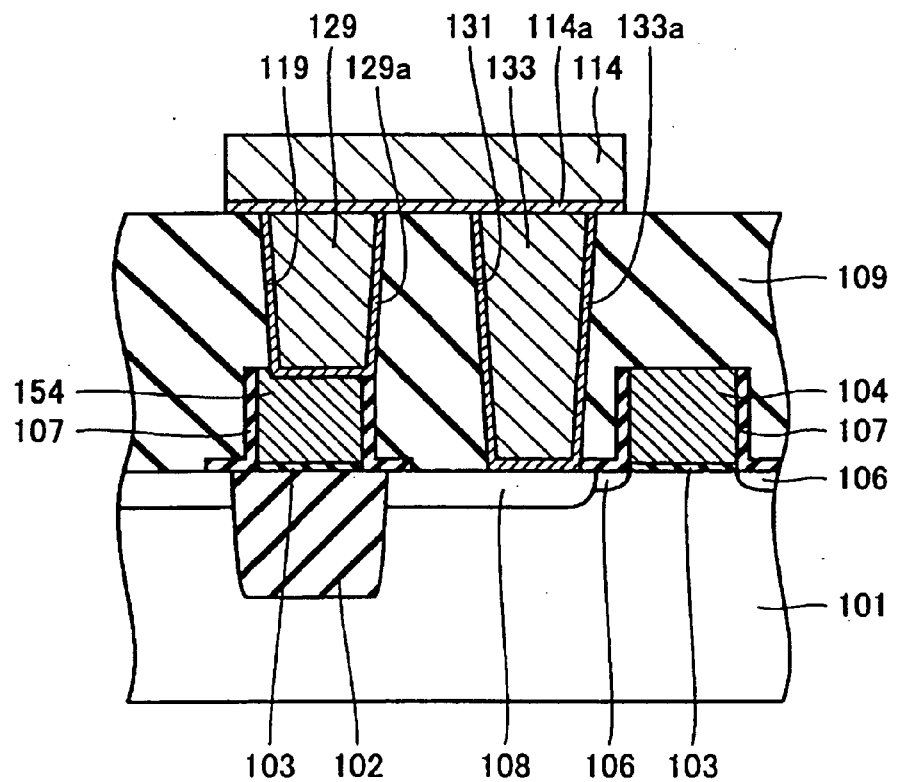
FIG. 44 is a sectional view taken along the line XLIV—XLIV in FIG. 43.

As shown in FIGS. 41 and 42, the plug wire 15 is formed to fill up the contact hole 52. The barrier metal layer 15a of the plug wire 15 is formed by a multilayer film consisting of a TiN layer of 20 nm and a Ti layer of 20 nm. Tungsten is deposited inside the barrier metal layer 15a by 200 nm by CVD and polished by CMP for forming the tungsten plug 15. The second layer wire 54 is formed by depositing the upper tungsten layer 14 of 100 nm and the lower multilayer film 14a consisting of a TiN layer of 20 nm and a Ti layer of 20 nm.

Thus, the plug wire 15 connects the active region 8 and the first layer wire 54 with each other, whereby the electric resistance of the plug 15 can be reduced. Further, the layout area of a portion generally rated at a contact hole pitch can be reduced.

The elements (e1) to (e10) forming the semiconductor device according to this embodiment can be modified as follows, for example. Other modifications are also available within the range of the present invention, as a matter of course.

(e1) Gate Electrode: The gate electrode 4, made of polysilicon in this embodiment, may alternatively be prepared from doped polysilicon. Polysilicide stacked with silicide such as $WSi_2$, $CoSi_2$ or $NiSi_2$ may also be employed as the material for the gate electrode 4. Further, a polymetal stacked with a metal such as W, Al, Ru or Pt or a metal such as W or Al itself may be employed.

(e2) Active Region: The plug wire 15 is directly electrically connected to the $n^+$-conductivity type high-concentration layer of the active region 8 in this embodiment. The surface layer of the active region 8 may alternatively be made of silicide such as $WSi_2$, $CoSi_2$ or $NiSi_2$, in order to reduce electric resistance from the active region 8 to the plug wire 15.

(e3) Plug Wire: The plug wire 15 is made of tungsten in this embodiment. The plug wire 15 may alternatively be made of polycrystalline silicon or a metal such as Al, TiN or Ru.

(e4) Barrier Metal Layer of Plug Wire: The barrier metal layer 15a of the plug wire 15 is formed by CVD, as hereinabove described. Alternatively, the barrier metal layer 15a of the plug wire 15 may be formed by sputtering. When the barrier metal layer 15a of the plug wire 15 is formed by a multilayer film of TiN and Ti through CVD or sputtering, the thicknesses of the Ti layer and the TiN layer are preferably 1 to 100 nm respectively.

(e5) Second Layer Wire: The second layer wire 14 is formed following formation of the plug wire 15 (15a), as hereinabove described. In this case, a tungsten film may be formed after opening the contact hole 52 for forming the second layer wire 14 as such. The second layer wire 14 may not be formed if the gate electrode 4 and the active region 8 are simply connected with each other.

(e6) Upper Layer Insulator Film for Gate Electrode: While the gate electrode 4 is made of polysilicon in this embodiment, an oxide film, a nitride film or a multilayer film of oxide and nitride may be arranged thereon as a hard mask. In this case, the plug wire 15 can be readily electrically connected to the gate electrode 4 by optimizing etching conditions when forming the plug wire 15.

(e7) Interlayer Isolation Film: According to this embodiment, the HDP oxide film is directly formed to cover the gate electrode 4 and the active region 8 for defining the interlayer isolation film 9, followed by opening of the contact hole 52. Alternatively, a nitride film or a multilayer film of nitride and oxide may be formed for thereafter opening the contact hole 52 by etching in an SAC (self align contact) system.

(e8) Element Isolation Film etc.: While the element isolation film 2 and the interlayer isolation film 9 are formed by HDP oxide films in this embodiment, FSG (F-doped silicate glass) films, BPSG films, PSG films, SiOC films, organic films, SiON films, SiC films or SiCF films may alternatively be employed.

(e9) Side Wall Inner-Layer Insulator Film: While the nitride films for defining the side wall inner insulator films 7 are 10 nm in this embodiment, the nitride films may alternatively be 1 to 90 nm. If a large selection ratio can be set when removing the side wall outer-layer spacers 17, oxide films or a multilayer structure of oxynitride films and oxide films may be employed for the side wall insulator films 7.

(e10) Side Wall Outer-Layer Spacer: While the side wall outer-layer spacers are formed by oxide films in this embodiment, PSG (phosphosilicate glass) or BPSG (borophosphosilicate glass) films may alternatively be employed if a large etching selection ratio can be set when removing the side wall outer-layer spacers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an active region included in a transistor formed on a semiconductor substrate;
    a wire formed on said semiconductor substrate;
    an interlayer isolation film covering said active region and said wire; and
    a plug wire having a shape overlapping with both of said wire and said active region in plane through said interlayer isolation film, for electrically connecting said wire and said active region with each other,
    wherein:
        said wire has side surfaces which are covered with an insulating layer continuously covering the side surfaces of said wire and a surface part of said semiconductor substrate located on the base of said side surfaces in a cross section of said wire;
        said insulating layer is located between said wire and said plug wire, and is in contact with said wire;
        said insulating layer is not a side wall spacer; and
        said insulating layer covers said semiconductor substrate such that it extends outward from said wire.

2. The semiconductor device according to claim 1, wherein said wire is the gate electrode of a transistor located adjacent to said transistor including said active region.

3. The semiconductor device according to claim 1, wherein said wire is located on an element isolation film isolating an element region to which said transistor including said active region belongs from another element region.

4. The semiconductor device according to claim 1, wherein said wire has the same structure as a gate electrode of said transistor including said active region.

5. The semiconductor device according to claim 1, wherein at least the surface of said active region is formed by a silicide layer, and said plug wire and said active region are electrically connected with each other through said silicide layer.

6. The semiconductor device according to claim 1, further comprising a second wire electrically connected to said plug wire on said interlayer isolation film.

7. The semiconductor device according to claim 1, wherein said plug wire is formed by copper plating.

8. A semiconductor device comprising:
    an active region included in a transistor formed on a semiconductor substrate;
    a wire formed on said semiconductor substrate;
    an interlayer isolation film covering said active region and said wire; and
    a plug wire having a shape overlapping with both of said wire and said active region in plane through said interlayer isolation film, for electrically connecting said wire and said active region with each other,
    wherein:
        said wire has side surfaces which are covered with an insulating layer covering only the side surfaces of said wire in a cross section of said wire;
        said insulating layer is located between said wire and said plug wire, and is in contact with said wire; and
        said insulating layer is not a side wall spacer.

9. The semiconductor device according to claim 8, wherein said wire is the gate electrode of a transistor located adjacent to said transistor including said active region.

10. The semiconductor device according to claim 8, wherein said wire is located on an element isolation film isolating an element region to which said transistor including said active region belongs from another element region.

11. The semiconductor device according to claim 8, wherein said wire has the same structure as a gate electrode of said transistor including said active region.

12. The semiconductor device according to claim 8, wherein at least the surface of said active region is formed by a silicide layer, and said plug wire and said active region are electrically connected with each other through said silicide layer.

13. The semiconductor device according to claim 8, further comprising a second wire electrically connected to said plug wire on said interlayer isolation film.

14. The semiconductor device according to claim 8, wherein said plug wire is formed by copper plating.

15. A semiconductor device comprising:

an active region included in a transistor formed on a semiconductor substrate;

a wire formed on said semiconductor substrate;

an interlayer isolation film covering said active region and said wire;

a plug wire having a shape overlapping with both of said wire and said active region in plane through said interlayer isolation film, for electrically connecting said wire and said active region with each other; and a second active region included in a transistor, different from said transistor including said active region, located adjacent to said wire, wherein said plug wire is provided in a shape also overlapping with said second active region in plane in addition to said wire and said active region for electrically connecting said wire and said active region with said second active region.

* * * * *